(12) United States Patent
Sagong et al.

(10) Patent No.: US 10,262,998 B2
(45) Date of Patent: Apr. 16, 2019

(54) SEMICONDUCTOR DEVICE AND METHOD OF MANUFACTURING THE SAME

(71) Applicant: Samsung Electronics Co., Ltd., Suwon-si (KR)

(72) Inventors: Hyun-chul Sagong, Hwaseong-si (KR); Sang-woo Pae, Seongnam-si (KR); Sung-young Yoon, Gongju-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/345,833

(22) Filed: Nov. 8, 2016

(65) Prior Publication Data

US 2017/0141113 A1    May 18, 2017

(30) Foreign Application Priority Data

Nov. 13, 2015    (KR) ........................ 10-2015-0159696

(51) Int. Cl.
| | | |
|---|---|---|
| *H01L 27/092* | (2006.01) | |
| *H01L 29/06* | (2006.01) | |
| *H01L 29/08* | (2006.01) | |
| *H01L 21/8238* | (2006.01) | |
| *H01L 29/78* | (2006.01) | |
| *H01L 27/02* | (2006.01) | |

(52) U.S. Cl.
CPC .. *H01L 27/0924* (2013.01); *H01L 21/823807* (2013.01); *H01L 27/092* (2013.01); *H01L 27/0922* (2013.01); *H01L 29/0673* (2013.01); *H01L 29/0847* (2013.01); *H01L 29/78* (2013.01); *H01L 21/823821* (2013.01); *H01L 27/0207* (2013.01)

(58) Field of Classification Search
CPC ....... H01L 2924/13066; H01L 29/7311; H01L 29/7376; H01L 29/66931; H01L 21/823431; H01L 27/0886; H01L 27/0924; H01L 27/10826; H01L 27/10876; H01L 27/1211; H01L 29/41791; H01L 29/66772
See application file for complete search history.

(56) References Cited

U.S. PATENT DOCUMENTS

| | | | |
|---|---|---|---|
| 6,900,503 B2 | 5/2005 | Oh et al. | |
| 7,682,888 B2 | 3/2010 | Lee et al. | |
| 7,816,198 B2 | 10/2010 | Ostermayr et al. | |
| 8,138,035 B2 | 3/2012 | Xiong et al. | |
| 8,604,524 B2 | 12/2013 | Rost | |
| 8,629,477 B2 | 1/2014 | Lochtefeld et al. | |

(Continued)

FOREIGN PATENT DOCUMENTS

JP        5085002        11/2012

*Primary Examiner* — Marcos D Pizarro Crespo
*Assistant Examiner* — Shannon G Yi
(74) *Attorney, Agent, or Firm* — Onello & Mello, LLP

(57) ABSTRACT

A semiconductor device includes a substrate including a first active area extending in a first direction and a second active area extending in a second direction and connected to the first active area; first and second gate structures respectively crossing the first and second active areas; a first region in an area where the first and second active areas are connected to each other, the first region being on a first side of each of the first and second gate structures; a second region in the first active area on the other side of the first gate structure; and a third region formed in the second active area on the other side of the second gate structure.

9 Claims, 32 Drawing Sheets

(56) References Cited

U.S. PATENT DOCUMENTS

| | | | |
|---|---|---|---|
| 8,735,993 B2* | 5/2014 | Lo ..................... | H01L 27/0255 257/347 |
| 9,053,966 B2 | 6/2015 | Xiong et al. | |
| 2015/0102428 A1 | 4/2015 | Adam et al. | |
| 2015/0179768 A1 | 6/2015 | Chen et al. | |
| 2017/0077096 A1* | 3/2017 | Wu ..................... | H01L 27/0922 |

* cited by examiner

SEMICONDUCTOR DEVICE AND METHOD OF MANUFACTURING THE SAME

CROSS-REFERENCE TO RELATED APPLICATION

This application claims the benefit of Korean Patent Application No. 10-2015-0159696, filed on Nov. 13, 2015, in the Korean Intellectual Property Office, the disclosure of which is incorporated herein in its entirety by reference.

FIELD OF INVENTION

Embodiments of the inventive concept relate to a semiconductor device and a method of manufacturing the same, and more particularly, to a semiconductor device including a transistor and a method of manufacturing the semiconductor device.

BACKGROUND

Increasing the operating speed of a semiconductor device included in an electronic device is necessary to improve performance of the electronic device. However, as semiconductor devices tend to be miniaturized, there is a limitation to improving a driving speed of electronic devices.

SUMMARY

The inventive concept provides a semiconductor device including a transistor that operates at high speed. Also, the inventive concept provides a semiconductor device including a transistor that may be controlled to operate at high speed and at low speed.

According to various aspects of the inventive concept, there is provided a semiconductor device including: a substrate including a first active area extending in a first direction and a second active area extending in a second direction and connected to the first active area; first and second gate structures respectively crossing the first and second active areas; a first region in an area where the first and second active areas are connected to each other, the first region being on a side of each of the first and second gate structures; a second region being doped with impurities in the first active area on the other side of the first gate structure; and a third region being doped with impurities in the second active area on the other side of the second gate structure.

According to other aspects of the inventive concept, there is provided a semiconductor device including: a substrate including a first active area extending in a first direction and a second active area extending in a second direction and connected to the first active area; and first and second gate structures respectively crossing the first and second active areas, wherein the first active area and the first gate structure form a first transistor, the first active area and the second gate structure form a second transistor, and the first and second transistors are of the same type and are one of N-type transistors and P-type transistors.

According to other aspects of the inventive concept, there is provided a semiconductor device including a substrate having a crystalline direction in a first direction; a first active area extending from a first impurity region to a second impurity region in the first direction; a second active area extending from the first impurity region to a third impurity region in a second direction, different from the first direction; a first gate structure crossing the first active area between the first impurity region and the second impurity region; and a second gate structure crossing the second active area between the first impurity region and the third impurity region.

BRIEF DESCRIPTION OF THE DRAWINGS

FIGS. 4 to 7 and 9 are cross-sectional view diagrams of semiconductor devices according to aspects of the present inventive concept, wherein FIGS. 4 to 7 and 9 are cross-sectional views taken along the line A1-A1 of FIG. 3;

FIG. 14 is a cross-sectional view diagram of a semiconductor device according to aspects of the present inventive concept, wherein FIG. 14 shows a cross-section taken along the line A3-A3 of FIG. 13;

DETAILED DESCRIPTION OF EMBODIMENTS

Hereinafter, the inventive concept will be described in detail by explaining embodiments of the inventive concept with reference to the attached drawings.

Figure 1:
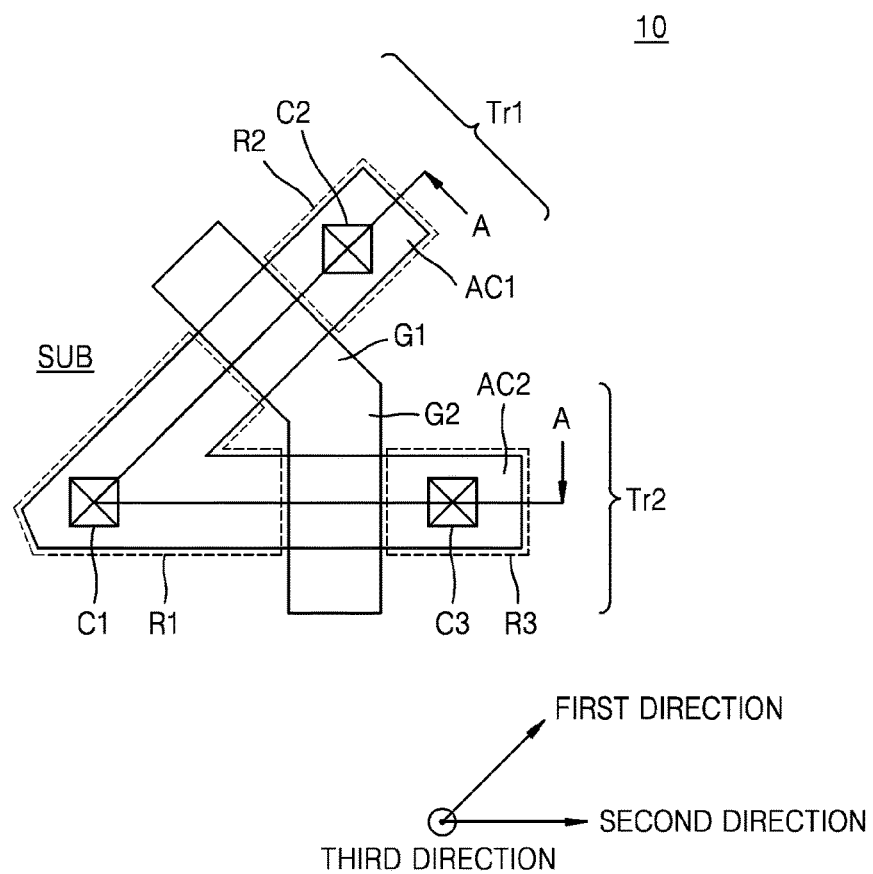
FIG. 1 is a schematic layout diagram of a semiconductor device according to aspects of the present inventive concept.

FIG. 1 is a schematic layout diagram of a semiconductor device 10 according to aspects of the present inventive concept.

Figure 2:
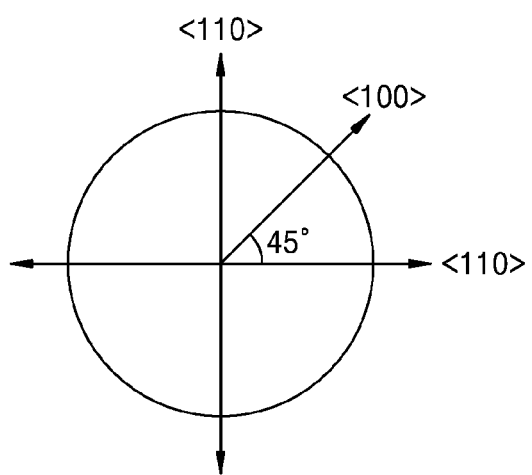
FIG. 2 is a diagram of extension directions in an active area with respect to a crystalline direction of a substrate on which the semiconductor device of FIG. 1 is formed.

FIG. 2 is a diagram of extension directions in an active area with respect to a crystalline direction of a substrate SUB on which the semiconductor device 10 of FIG. 1 is formed.

Referring to FIGS. 1 and 2, the substrate SUB may include a first active area AC1 extending in a first direction and a second active area AC2 extending in a second direction and connected to the first active area AC1. The first and second active areas AC1 and AC2 may be defined by an isolation layer (not shown). The first and second active areas AC1 and AC2 may have various structures such as a fin-shaped structure, a structure including a nano-wire channel, and a planar-shaped structure, and the structures will be described below with reference to FIGS. 4 to 14.

In this case, the crystalline direction of the substrate SUB may be a direction 110. Also, the second direction of the second active area AC2 may be the direction 110 that is the same as the crystalline direction of the substrate SUB, and the first direction of the first active area AC1 may be a direction 100 that forms a 45 degree angle with the second direction.

On the substrate SUB, first and second gate structures G1 and G2 that respectively cross the first and second active areas AC1 and AC2 may be formed. Although shown connected to each other in FIG. 1, first and second gate structures G1 and G2 may or may not be connected to each other. For example, first and second gate structures G1 and G2 may be spaced apart from each other.

On one side of each of the first and second gate structures G1 and G2, a first impurity region R1 may be formed in an area where the first and second active areas AC1 and AC2 are connected to each other. Also, on the other side of the first gate structure G1, a second impurity region R2 may be formed in the first active area AC1. Also, on the other side of the second gate structure G2, a third impurity region R3 may be formed in the second active area AC2. The first to third impurity regions R1 to R3 may function as source/drain regions.

In this case, either one of the second and third impurity regions R2 and R3 is doped with impurities of the same conductive type as impurities doping the first impurity region R1, and the other of the second and third impurity regions R2 and R3 is doped with impurities of a different conductive type from impurities doping the first impurity region R1. For example, the first impurity region R1 may be doped with n-type impurities, the second impurity region R2 may be doped with impurities of the same type, that is, the n-type impurities, and the third impurity region R3 may be doped with impurities of a different type, that is, p-type impurities.

An area of the substrate SUB which faces the first gate structure G1 between the first and second impurity regions R1 and R2 may include a well, an impurity region, or the like in such a manner that the area has impurities of a different conductive type from the impurities in the second impurity region R2. Likewise, an area of the substrate SUB which faces the second gate structure G2 between the first and third impurity regions R1 and R3 may include a well, an impurity region, or the like in such a manner that the area has impurities of a different conductive type from the impurities in the third impurity region R3. For example, when the second impurity region R2 is doped with n-type impurities, the area of the substrate SUB which faces the first gate structure G1 between the first and second impurity regions R1 and R2 may include a well including p-type impurities. Likewise, when the third impurity region R3 is doped with p-type impurities, the area of the substrate SUB which faces the second gate structure G2 between the first and third impurity regions R1 and R3 may include a well including n-type impurities.

In this case, an impurity concentration of the first impurity region R1 may be lower than an impurity concentration of an area of the substrate SUB which has the same conductive type as the first impurity region R1. That is, based on the above example, an n-type impurity concentration of the first impurity region R1 may be lower than an n-type impurity concentration of an n-type well formed in the area of the substrate SUB that faces the second gate structure G2 between the first and second impurity regions R1 and R2.

Accordingly, a first transistor Tr1 including the first active area AC1, the first gate structure G1, and the first and second impurity regions R1 and R2 may operate as an n-type transistor. Also, a second transistor Tr2 including the second active area AC2, the second gate structure G2, and the first and third impurity regions R1 and R3 may operate as a p-type transistor.

The crystalline direction of the substrate SUB may affect effective mobility of a carrier. As described above, when the substrate SUB has the crystalline direction 100, the first active area AC1 of the n-type first transistor Tr1 may extend in the first direction, that is, the direction 100. In this case, since electrons that are a main carrier of the n-type first transistor Tr1 move in the direction 100, effective mobility of the electrons may increase, compared to effective mobility of electrons moving in the direction 110. Also, the p-type second transistor Tr2 may extend in the second direction, that is, the direction 110. In this case, since holes that are a main carrier of the p-type second transistor Tr2 move in the direction 110, effective mobility of the holes may increase, compared to effective mobility of holes moving in the direction 100.

That is, as the main carriers of the n-type first transistor Tr1 and the p-type second transistor Tr2 have optimum effective mobility in the same substrate SUB, the semiconductor device 10 may have improved performance.

Also, the first and second transistors Tr1 and Tr2 share the first impurity region R1, and thus a structure of the semiconductor device 10 including the first and second transistors Tr1 and Tr2 may be simplified.

In the above example, the first and second impurity regions R1 and R2 are doped with the n-type impurities, and the third impurity region R3 is doped with the p-type impurity, but the inventive concept is not limited thereto. In some embodiments, the first impurity region is doped with the n-type impurity, and the second and third impurity regions R2 and R3 may be doped with the p-type impurities. In other embodiments, the first impurity region R1 may not include impurities that are inserted using an intentional impurity injection process. In other embodiments, the first to third impurity regions R1 to R3 may be doped with impurities of the same type. That is, all of the first to third impurity regions R1, R2 and R3 may be doped with n-type impurities or p-type impurities, which will be described with reference to FIGS. 4 to 10.

First, second, and third contact plugs C1, C2 and C3 may be formed in upper portions of the first to third impurity regions R1, R2 and R3, respectively. Source/drain voltages may be applied to the first and third contact plugs C1 and C3.

Figure 3:
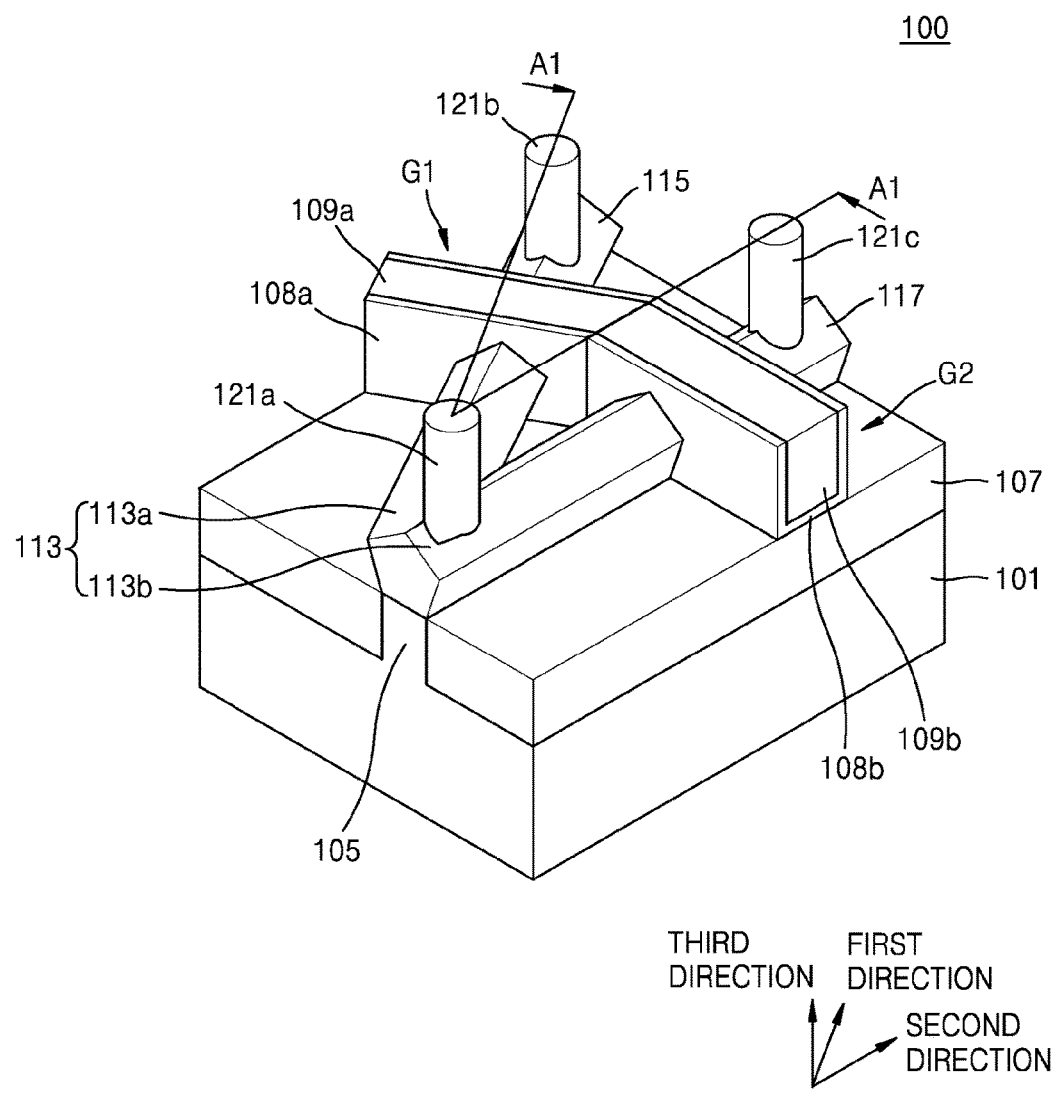
FIG. 3 is a perspective view diagram of a semiconductor device according to aspects of the present inventive concept, wherein a structure of FIG. 3 corresponds to the layout of the semiconductor device of FIG. 1, and a line A1-A1 of FIG. 3 corresponds to a line A-A of FIG. 1.

FIG. 3 is a perspective view diagram of a semiconductor device 100 according to aspects of the present inventive concept. The semiconductor device 100 corresponding to the layout of the semiconductor device 10 of FIG. 1 has a fin field-effect transistor (FinFET) structure. First and second fin-type structures 105a and 105b (of FIG. 16C) and first, second, and third growth layers 113, 115, and 117 disposed on the first and second fin-type structures 105a and 105b may correspond to the first and second active areas AC1 and AC2 of FIG. 1. First and second gate structures G1 and G2 may correspond to the first and second gate structures G1 and G2 of FIG. 1. The first growth layer 113 may include first and second portions 113a and 113b extending in the first and second directions, respectively. First, second, and third contact plugs 121a, 121b, and 121c may respectively correspond to first, second, and third contact plugs C1, C2, and C3 of FIG. 1. The line A1-A1 of FIG. 3 corresponds to the line A-A of FIG. 1. FIG. 16C shows a result before the first, second, and third growth layers 113, 115, and 117 and the first and second gate structures G1 and G2 are formed on the first and second fin-type structures 105a and 105b, and FIG. 16c with reference to FIG. 3 describes the first and second fin-type structures 105a and 105b for convenience.

Referring to FIG. 3, the semiconductor device 100 may include a substrate 101, a fin-type structure 105, an isolation layer 107, the first gate structure G1, the second gate structure G2, the first, second, and third growth layers 113, 115, and 117, and the first, second, and third contact plugs 121a, 121b, and 121c.

The substrate 101 may be formed based on a bulk wafer or a Silicon-on-insulator (SOI) wafer. The substrate 101 may include an IV-group semiconductor such as silicon (Si), and germanium (Ge), a IV-IV group compound semiconductor such as SiGe and silicon carbide (SiC), a III-V group compound semiconductor such as gallium arsenide (GaAs), indium arsenide (InAs) and indium phosphide (InP), or a combination thereof. Also, the substrate 101 may be formed based on an epitaxial wafer, a polished wafer, an annealed wafer, etc.

The substrate 101 may be a p-type substrate including p-type impurity ions or an n-type substrate including n-type impurity ions. Also, the substrate 101 may partially include a well doped with high-concentration impurity ions or a structure doped with impurities.

Referring to FIG. 16C together with FIG. 3, the fin-type structure 105 may be formed on the substrate 101. In detail, the fin-type structure 105 may include the first and second fin-type structures 105a and 105b respectively extending in the first and second directions. The first and second fin-type structures 105a and 105b may include protrusions protruding toward an upper surface of the isolation layer 107 from part of upper portions of the first and second fin-type structures 105a and 105b in an area where the first and second fin-type structures 105a and 105b overlap the first and second gate structures G1 and G2. Accordingly, the first and second gate structures G1 and G2 may contact side surfaces and upper surfaces of the protrusions of the first and second fin-type structures 105a and 105b.

Also, the first and second fin-type structures 105a and 105b may include recessed base portions formed to have the same upper surface as the upper surface of the isolation layer 107 in an area where the first and second fin-type structures 105a and 105b do not overlap the first and second gate structures G1 and G2. When operating as a transistor, the protrusion of the fin-type structure 105 may be an active area where a channel is formed. The first and second fin-type structures 105a and 105b are part of the substrate 101, but may include an epitaxial layer growing from the substrate 101.

The crystalline direction of the substrate 101 may be the direction 110. In this case, the first direction of the first fin-type structure 105a may be the direction 100 forming a 45 degree angle with the crystalline direction of the substrate 101, and the second direction of the second fin-type structure 105b may be the direction 110 that is the same as the crystalline direction of the substrate 101.

The isolation layer 107 defining the first and second fin-type structures 105a and 105b may be formed on the substrate 101. The isolation layer 107 fills a gap between the first and second fin-type structures 105a and 105b, and a portion of upper surfaces of the protrusions of the first and second fin-type structures 105a and 105b may protrude toward the upper surface of the isolation layer 107. The isolation layer 107 may include silicon oxide, silicon nitride, silicon oxynitride, or a combination thereof.

The first and second gate structures G1 and G2 may extend such that they may respectively cross the first and second fin-type structures 105a and 105b on the isolation layer 107. Referring to FIG. 16C together, the first gate structure G1 may cross the first fin-type structure 105a, and the second gate structure G2 may cross the second fin-type structure 105b. The first gate structure G1 may be perpendicular to the first direction, and the second gate structure G2 may be perpendicular to the second direction. However, the inventive concept is not limited thereto.

The first gate structure G1 may include a gate insulating layer 108a that is conformally formed on side walls and a lower surface of the first gate structure G1 and a gate electrode layer 109a formed on the gate insulating layer 108a. Likewise, the second gate structure G2 may include a gate insulating layer 108b that is conformally formed on side walls and a lower surface of the second gate structure G2 and a gate electrode layer 109b formed on the gate insulating layer 108b. The gate insulating layers 108a and 108b may include a silicon oxide layer, a silicon nitride layer, a silicon oxynitride layer, oxide/nitride/oxide (ONO), a high-k dielectric film having a higher dielectric constant than the silicon oxide layer, or a combination thereof.

The gate electrode layers 109a and 109b may include multiple layers, and the layers may conformally cover the sidewalls and the lower surfaces of the gate insulating layers 108a and 108b. For example, the gate electrode layers 109a and 109b may include a first metallic layer for adjusting a work function and a second metallic layer for filling other spaces on the first metallic layer. The first metallic layer may include at least one of titanium nitride (TiN), tantalum nitride (TaN), titanium carbide (TiC), and tantalum carbide (TaC). The second metallic layer may include tungsten (W) or aluminum (Al). The gate electrode layers 109a and 109b may be semiconductor layers.

The first, second, and third growth layers 113, 115, and 117 may be respectively formed on base portions of the first and second fin-type structures 105a and 105b. The first growth layer 113 may be formed on the first and second fin-type structures 105a and 105b on one side of each of the first and second gate structures G1 and G2. The first growth layer 113 may include a first impurity region formed in an area where the first and second fin-type structures 105a and 105b are connected to each other.

The second growth layer 115 may be fainted on the first fin-type structure 105a on the other side of the first gate structure G1. The first and second growth layers 113 and 115 may be source/drain areas where source/drain voltages are applied on both sides of the first gate structure G1. The second growth layer 115 may include a second impurity region. That is, the first fin-type structure 105a, the first gate structure G1. and the first and second growth layers 113 and 115, respectively including the first and second impurity regions, may be included in the first transistor Tr1.

The third growth layer 117 may be formed on the second fin-type structure 105b on the other sides of the second gate structure G2. The first and third growth layers 113 and 117 may be source/drain areas where source/drain voltages are applied on both sides of the second gate structure G2 The third growth layer 117 may be a third impurity region. That is, the second fin-type structure 105b, the second gate structure G2, and the first and third growth layers 113 and 117 respectively including the first and third impurity regions may be included in the second transistor Tr2.

The first and second transistors Tr1 and Tr2 share the first impurity region of the first growth layer 113 that functions as the source/drain areas, and thus a structure of the semiconductor device 100 may be simplified.

The first, second, and third growth layers 113, 115, and 117 have pentagonal cross-sections, but the inventive concept is not limited thereto. The first, second, and third growth layers 113, 115, and 117 may have various shapes on the first and second fin-type structures 105a and 105b. For example, the first, second, and third growth layers 113, 115, and 117 may have at least one of a diamond shape, a circular shape, a rectangular shape, and a hexagonal shape.

The first, second, and third contact plugs 121a, 121b, and 121c which apply the source/drain voltages may be formed on the first, second, and third growth layers 113, 115, and 117, respectively. An interlayer insulating layer (not shown) may be formed on the isolation layer 107 such that gaps between the first, second, and third growth layers 113, 115, and 117, the first and second gate structures G1 and G2, and first, second, and third contact plugs 121a, 121b, and 121c are filled, and the first, second, and third growth layers 113, 115, and 117, the first and second gate structures G1 and G2, and the first, second, and third contact plugs 121a, 121b, and 121c are electrically insulated from each other. However, the interlayer insulating layer is not shown in the drawings for convenience.

Conductive types of impurity regions formed on the first, second, and third growth layers 113, 115, and 117 will be described below with reference to FIGS. 4 to 10.

Figure 4:
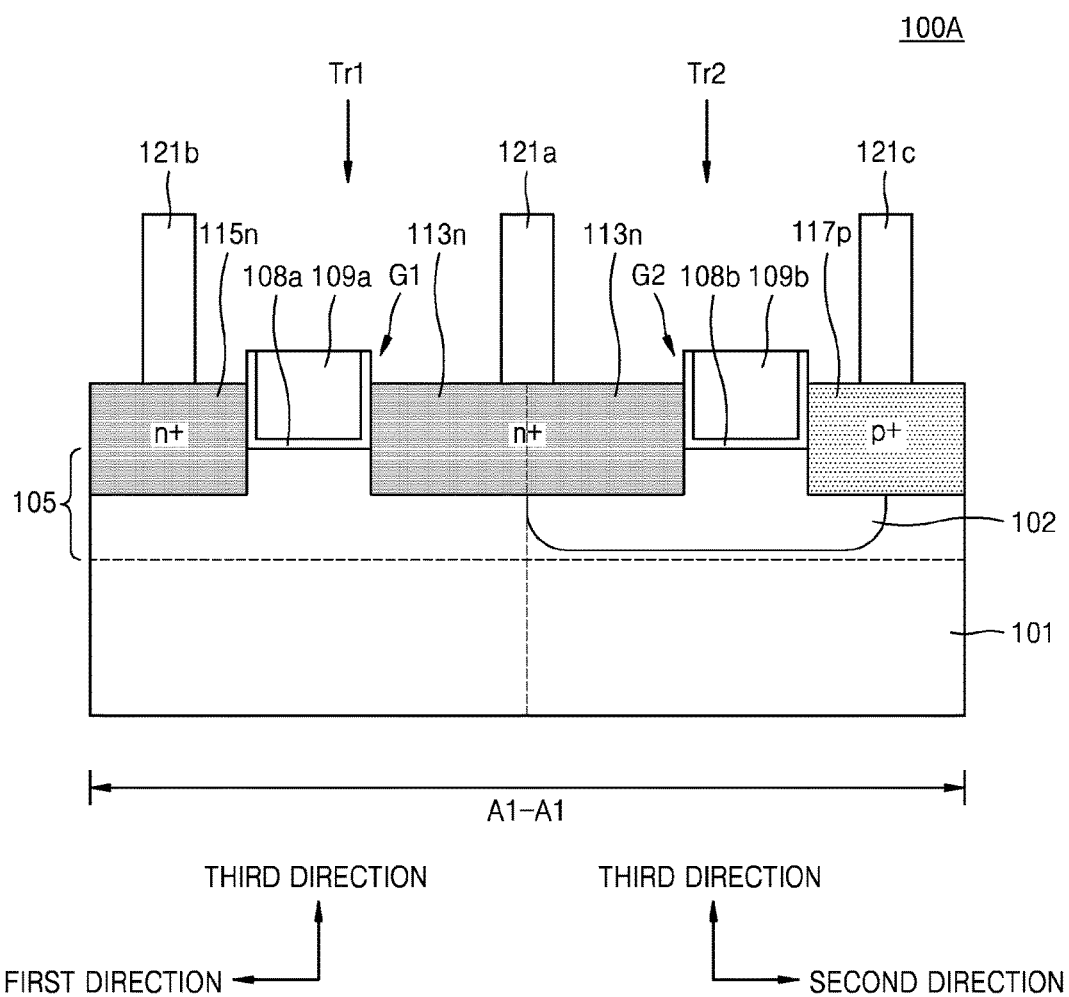
Figure 5:
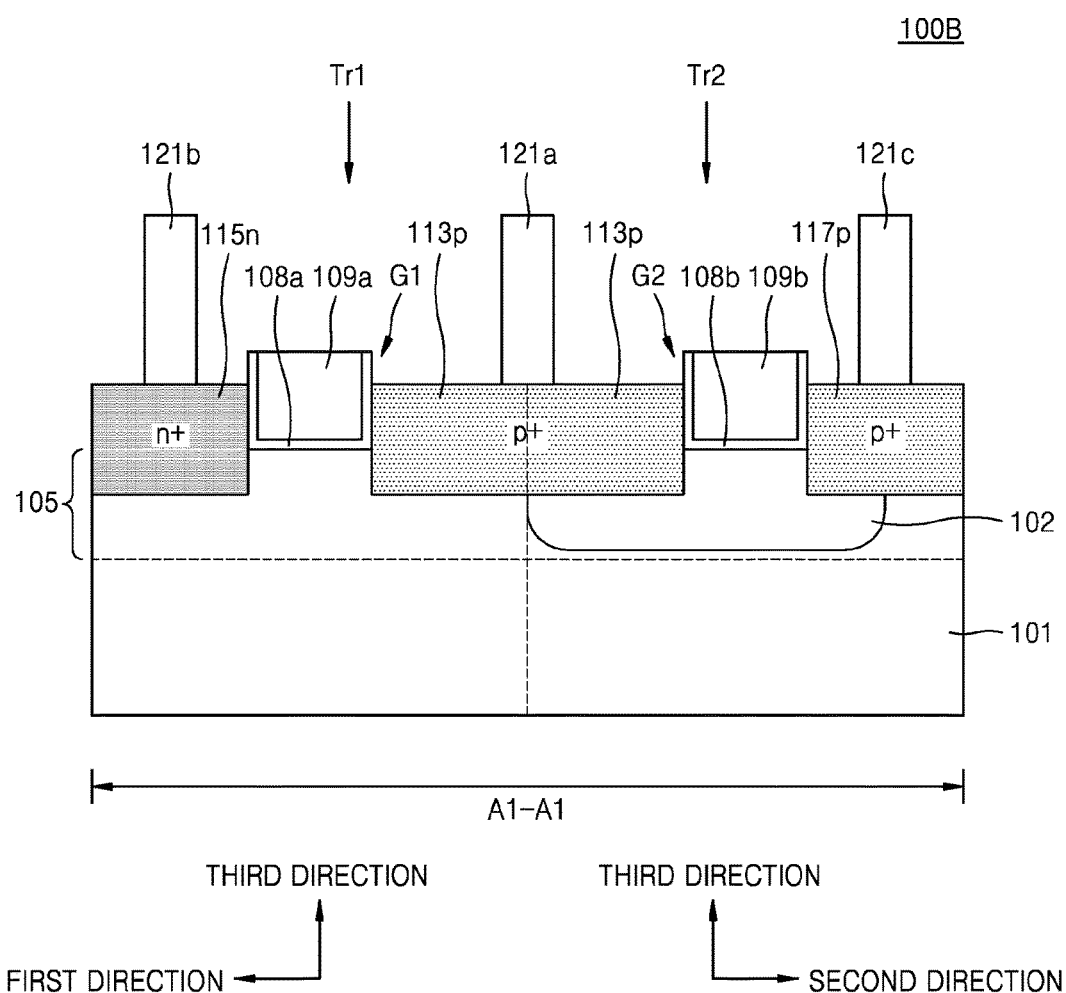
Figure 6:
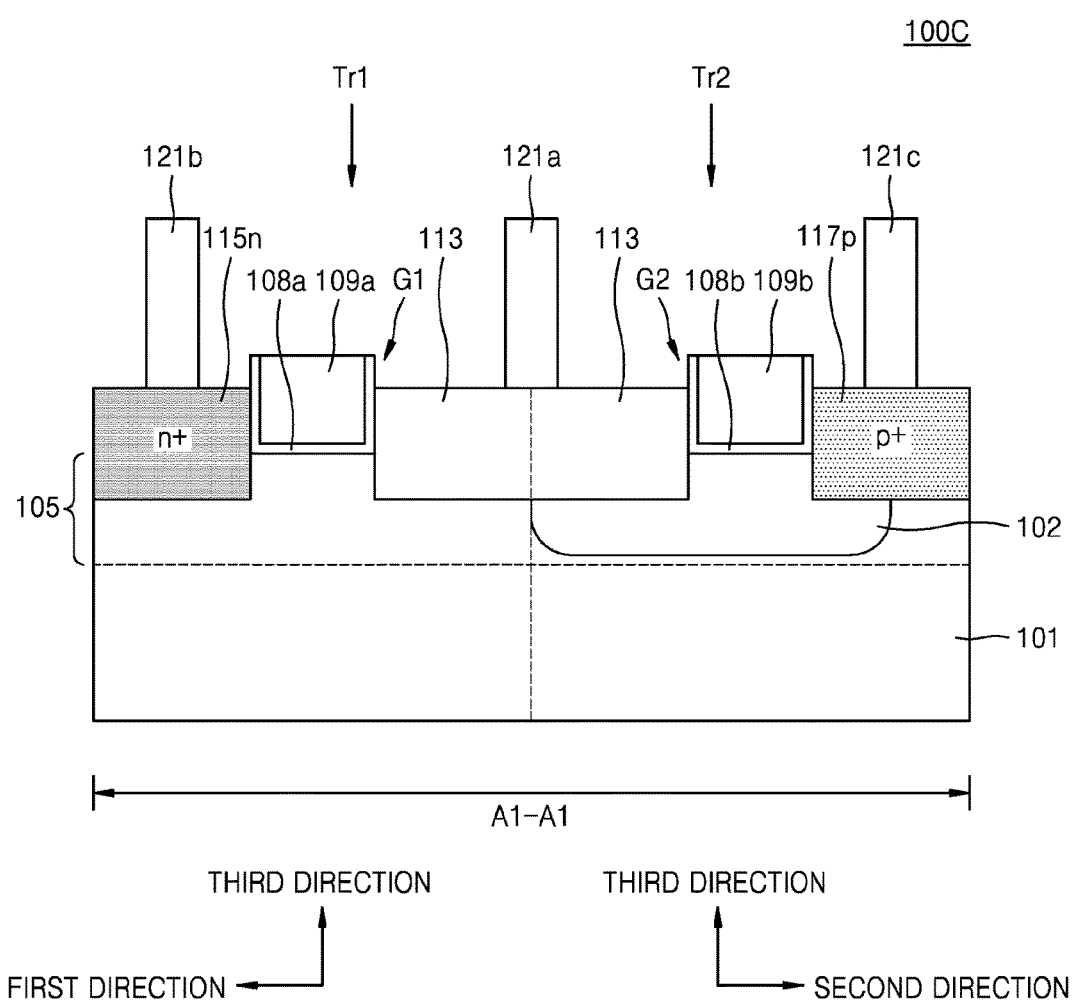

FIGS. 4 to 6 are cross-sectional view diagrams of semiconductor devices 100A, 100B, and 100C, respectively, according to aspects of the present inventive concept. FIGS. 4 to 6 depict cross-sections taken along the line A1-A1 of FIG. 3.

Referring to FIGS. 3 and 4, the substrate 101 may include p-type impurities. In this case, a first impurity region 113n of the first growth layer 113 and a second impurity region 115n of the second growth layer 115 may include n-type impurities. Accordingly, the first transistor Tr1 including the first fin-type structure 105a, the first gate structure G1, and the first and second growth layers 113 and 115 may operate as an n-type transistor. A channel is formed in the first fin-type structure 105a (FIG. 16C) contacting the first gate structure G1 and a carrier may move in the first direction, that is, the direction 100, due to source/drain voltages applied to the first and second growth layers 113 and 115. Effective mobility of electrons that are a main carrier of the n-type transistor increases more in the direction 100 than in the direction 110, that is, the crystalline direction of the substrate 101, and thus performance of the semiconductor device 100A may be improved.

The substrate 101 may include an n-type well 102 in an area facing the second gate structure G2 between the first and third growth layers 113 and 117. Also, the third impurity region 117p of the third growth layer 117 may include p-type impurities. Accordingly, the second transistor Tr2 including the second fin-type structure 105b (FIG. 16C), the second gate structure G2 and the first and third growth layers 113 and 117 may operate as the p-type transistor. Concentration of the n-type impurities in the first impurity region 113n of the first growth layer 113 may be lower than concentration of the n-type impurities in the n-type well 102.

A channel is formed in the second fin-type structure 105b contacting the second gate insulating layer 108b, and a carrier may move in the second direction, that is, the direction 110, due to source/drain voltages applied to the first and third growth layers 113 and 117. Since effective mobility of holes that are a main carrier of the p-type transistor increases in the direction 110, the second fin-type structure 105b is formed along in the crystalline direction of the substrate 101, that is, the direction 110. Thus, the performance of the semiconductor device 100A may be improved.

In the semiconductor device 100A, the n-type transistor and the p-type transistor are respectively arranged on the substrate 101 having one crystalline direction in such a manner that effective mobility of the main carrier is high. Thus, overall performance of the semiconductor device 100A may be improved. Also, first and second fin-type structures 105a and 105b of the n-type transistor and the p-type transistor are connected to each other and share source/drain areas, and thus a structure of the semiconductor device 100A may be simplified.

Referring to FIGS. 3 and 5, the semiconductor device 100B of FIG. 5 is similar to the semiconductor device 100A of FIG. 4, but is different therefrom because a first impurity region 113p of the first growth layer 113 may include p-type impurities. That is, the substrate 101 may include p-type impurities, the first impurity region 113p of the first growth layer 113 may include p-type impurities, the second impurity region 115n of the second growth layer 115 may include n-type impurities, and the third impurity region 117p of the third growth layer 117 may include p-type impurities. Concentration of the p-type impurities in the first impurity region 113p of the first growth layer 113 may be lower than concentration of the p-type impurities in the substrate 101.

Accordingly, the first fin-type structure 105a, the first gate structure G1, the first growth layer 113 including the p-type first impurity region 113p, and the second growth layer 115 including the n-type second impurity region 115n may form a first transistor Tr1. The first transistor Tr1 may operate as an n-type transistor. As described above, the channel is formed in the first fin-type structure 105a contacting the first gate insulating layer 108a, and the carrier may move in the first direction, that is, the direction 100, due to the source/drain voltages applied to the first and second growth layers 113 and 115.

The substrate 101 may include the n-type well 102 in the area facing the second gate structure G2, between the first and third growth layers 113 and 117. Accordingly, the second fin-type structure 105b, the second gate structure G2, the first growth layer 113 including the p-type first impurity region 113p, and the third growth layer 117 including the p-type third impurity region 117p may form a second transistor Tr2. The second transistor Tr2 may operate as a p-type transistor. As described above, the channel is formed in the second fin-type structure 105b contacting the second gate insulating layer 108b, and the carrier may move in the second direction, that is, the direction 110, due to the source/drain voltages applied to the first and third growth layers 113 and 117.

Referring to FIGS. 3 and 6, the semiconductor device 100C of FIG. 6 is similar to the semiconductor device 100A of FIG. 4, but is different therefrom because the first growth layer 113 does not include impurities. That is, the substrate 101 includes the p-type impurities, the first growth layer 113 may not include external impurities, the second impurity region 115n of the second growth layer 115 may include the n-type impurities, and the third impurity region 117p of the third growth layer 117 may include the p-type impurities.

Accordingly, the first fin-type structure 105a, the first gate structure G1, the first growth layer 113, and the second growth layer 115 including the n-type second impurity region 115n may form a first transistor Tr1. The first transistor Tr1 may operate as an n-type transistor.

Also, the substrate 101 may include the n-type well 102 in the area facing the second gate structure G2, between the first and third growth layers 113 and 117. Accordingly, the second fin-type structure 105b, the second gate structure G2, the first growth layer 113, and the third growth layer 117 including the p-type third impurity region 117p may form a second transistor Tr2. The second transistor Tr2 may operate as a p-type transistor.

Figure 7:
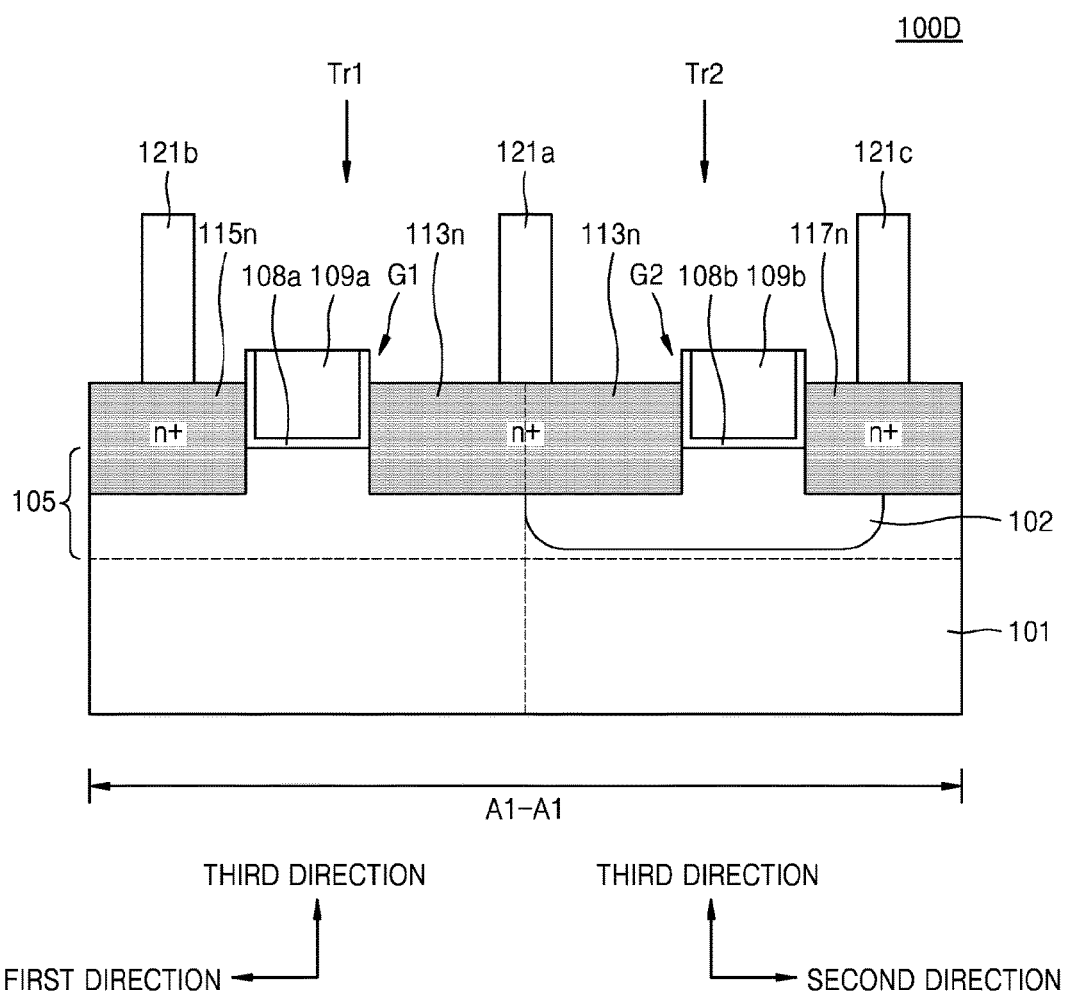

FIG. 7 is a cross-sectional view diagram of a semiconductor device 100D according to aspects of the present inventive concept. FIG. 7 is the cross-sectional view diagram showing a structure corresponding to the cross-section taken along the line A1-A1 of FIG. 3. The semiconductor device 100D of FIG. 7 is similar to the semiconductor device 100A of FIG. 4, but is different therefrom because the first and second impurity regions 113n and 115n of the first and second growth layers 113 and 115, and a third impurity region 117n of the third growth layer 117 include n-type impurities.

Referring to FIG. 7, the first fin-type structure 105a, the first gate structure G1, the first growth layer 113 including the n-type first impurity region 113n, and the second growth layer 115 including the n-type second impurity region 115n may form a first transistor Tr1. The first transistor Tr1 may operate as an n-type transistor.

In this case, since a carrier of the first transistor Tr1 moves in the first direction, that is, the direction 100, effective mobility of electrons that are a main carrier is high. Thus, the first transistor Tr1 may operate at high speed.

The second fin-type structure 105b, the second gate structure G2, the first growth layer 113 including the n-type first impurity region 113n, and the third growth layer 117 including the n-type third impurity region 117n may form a second transistor Tr2. The second transistor Tr2 may operate as an n-type transistor. In this case, since the carrier of the second transistor Tr2 moves in the second direction, that is, the direction 110, effective mobility of electrons that are a main carrier is reduced, and thus the second transistor Tr2 may operate at a relatively lower speed.

The crystalline direction of the substrate 101 is the direction 110, the first direction is the direction 100, and the second direction is the direction 110. However, the inventive concept is not limited thereto. An included angle between the first and second directions may vary between 0 and 180 degrees.

Figure 8:
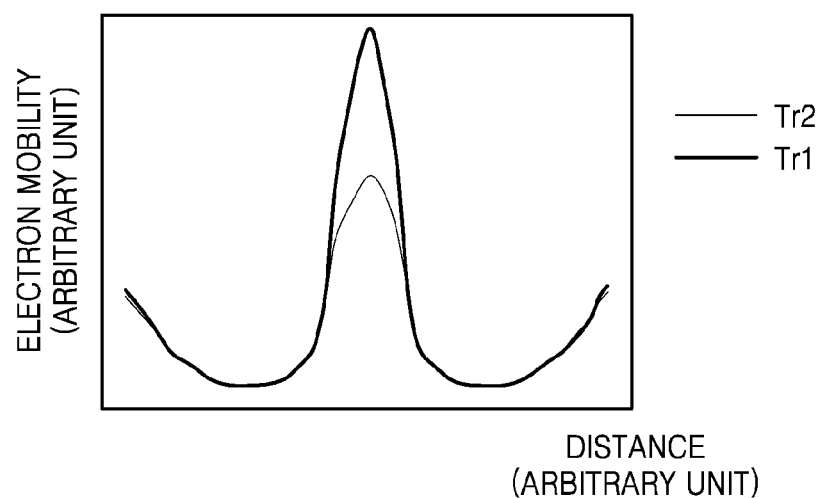
FIG. 8 is a graph showing electron mobility of a first N-type transistor arranged in a first direction of FIG. 7 and a second N-type transistor extending in a second direction of FIG. 7, according to aspects of the present inventive concept.

FIG. 8 is a graph showing electron mobility of a first N-type transistor arranged in the first direction of FIG. 7 and a second N-type transistor extending in the second direction of FIG. 7.

FIG. 8 is a graph showing electron mobility of the first fin-type structure 105a according to a distance in the first direction and electron mobility of the second fin-type structure 105b according to a distance in the second direction. In the graph, a section where peaks appear may correspond to the areas of the first and second fin-type structures 105a and 105b where a channel is formed opposite to the first gate structure G1 and the second gate structure G2.

Since the carrier of the n-type first transistor Tr1 moves in the first direction, that is, the direction 100, effective mobility of electrons that are a main carrier is high. On the other hand, since the carrier of the n-type second transistor Tr2 moves in the direction 110, effective mobility of electrons that are a main carrier is relatively lower.

Accordingly, effective mobility of electrons of the semiconductor device 100D of FIG. 7 may include both the n-type first transistor Tr1, which operates at high speed because of high effective mobility of electrons, and the n-type second transistor Tr2, which operates at a relatively lower speed because of lower effective mobility of electrons.

Figure 9:
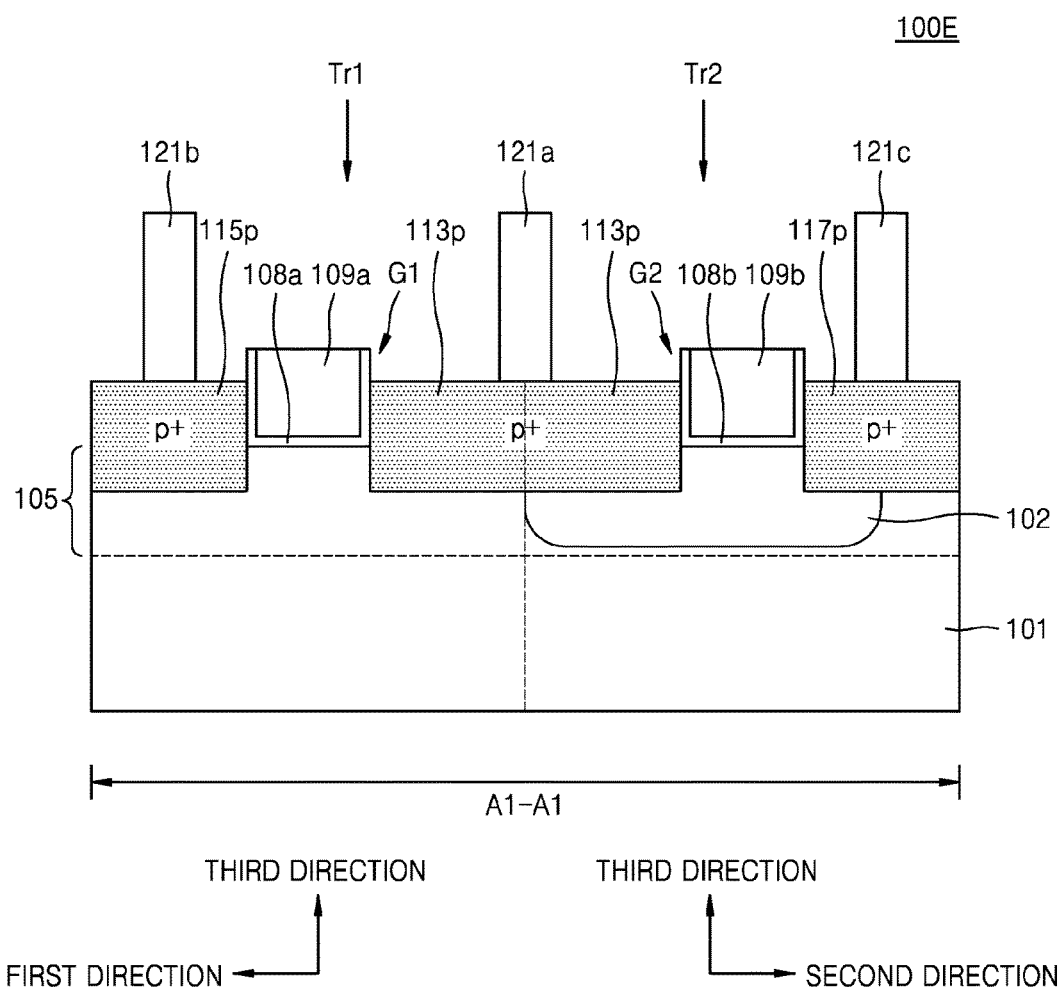

FIG. 9 is a cross-sectional view diagram of a semiconductor device 100E according to aspects of the present inventive concept. FIG. 9 shows a cross-section taken along the line A1-A1 of FIG. 3. The semiconductor device 100E of FIG. 9 is similar to the semiconductor device 100A of FIG. 4, but is different therefrom because the first impurity region 113p of the first growth layer 113, and second and third impurity regions 115p and 117p of the second and third growth layers 115 and 117 may include the p-type impurities. In this case, the substrate 101 may be an n-type substrate.

Referring to FIG. 9, the first fin-type structure 105a, the first gate structure G1, the first growth layer 113 including the p-type first impurity region 113p, and the second growth layer 115 including the p-type second impurity region 115p may form a first transistor Tr1. The first transistor Tr1 may operate as a p-type transistor.

In this case, since a carrier of the first transistor Tr1 moves in the first direction, that is, the direction 100, effective mobility of holes that are a main carrier is low such that the first transistor Tr1 may operate at low speed.

The second fin-type structure 105b, the second gate structure G2, the first growth layer 113, including the p-type first impurity region 113p, and the third growth layer 117 including the p-type third impurity region 117p may form a second transistor Tr2. The second transistor Tr2 may operate as a p-type transistor. In this case, since the carrier of the second transistor Tr2 moves in the second direction, that is, the direction 110, effective mobility of electrons that are a main carrier increase such that the second transistor Tr2 may operate at relatively higher speed.

Figure 10:
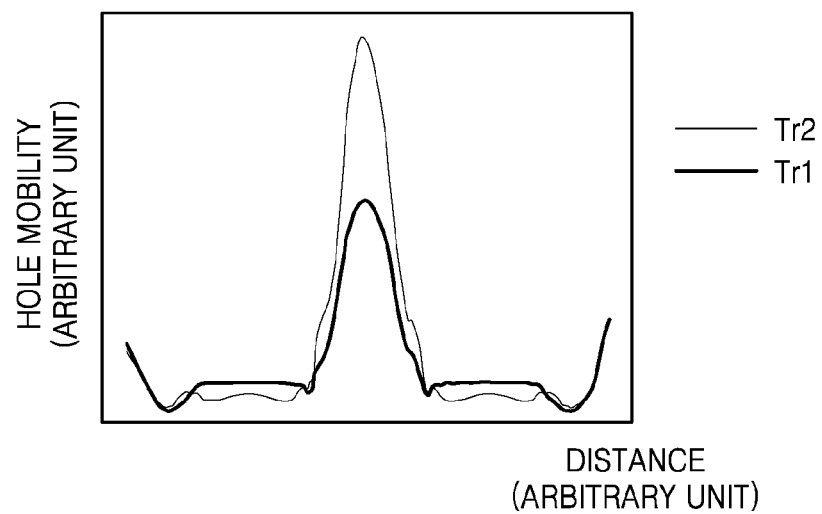
FIG. 10 is a graph showing hole mobility of a first P-type transistor extending in the first direction of FIG. 8 and a second P-type transistor arranged in the second direction of FIG. 8, according to aspects of the present inventive concept.

FIG. 10 is a graph showing hole mobility of a first transistor of a p-type extending in the first direction of FIG. 9 and a second transistor of a P-type arranged in the second direction of FIG. 9.

FIG. 10 shows hole mobility of the first fin-type structure 105a according to a distance in the first direction and hole mobility of the second fin-type structure 105b according to a distance in the second direction. Sections where peaks appear may be areas of the first and second fin-type structures 105a and 105b where a channel is formed opposite to the first gate structure G1 and the second gate structure G2.

Since a carrier of the p-type first transistor Tr1 moves in the first direction, that is, the direction 100, effective mobility of holes that are a main carrier is low. On the other hand, since a carrier of the p-type second transistor Tr2 moves in the second direction, that is, the direction 110, effective mobility of holes that are a main carrier may be relatively higher.

Accordingly, the semiconductor device 100E of FIG. 9 may include both the p-type first transistor Tr1, which operates at low speed due to low effective mobility of the holes in the first direction 100, and the p-type second transistor Tr2, which operates at relatively higher speed due to high effective mobility of the holes in the second direction 110.

Figure 11:
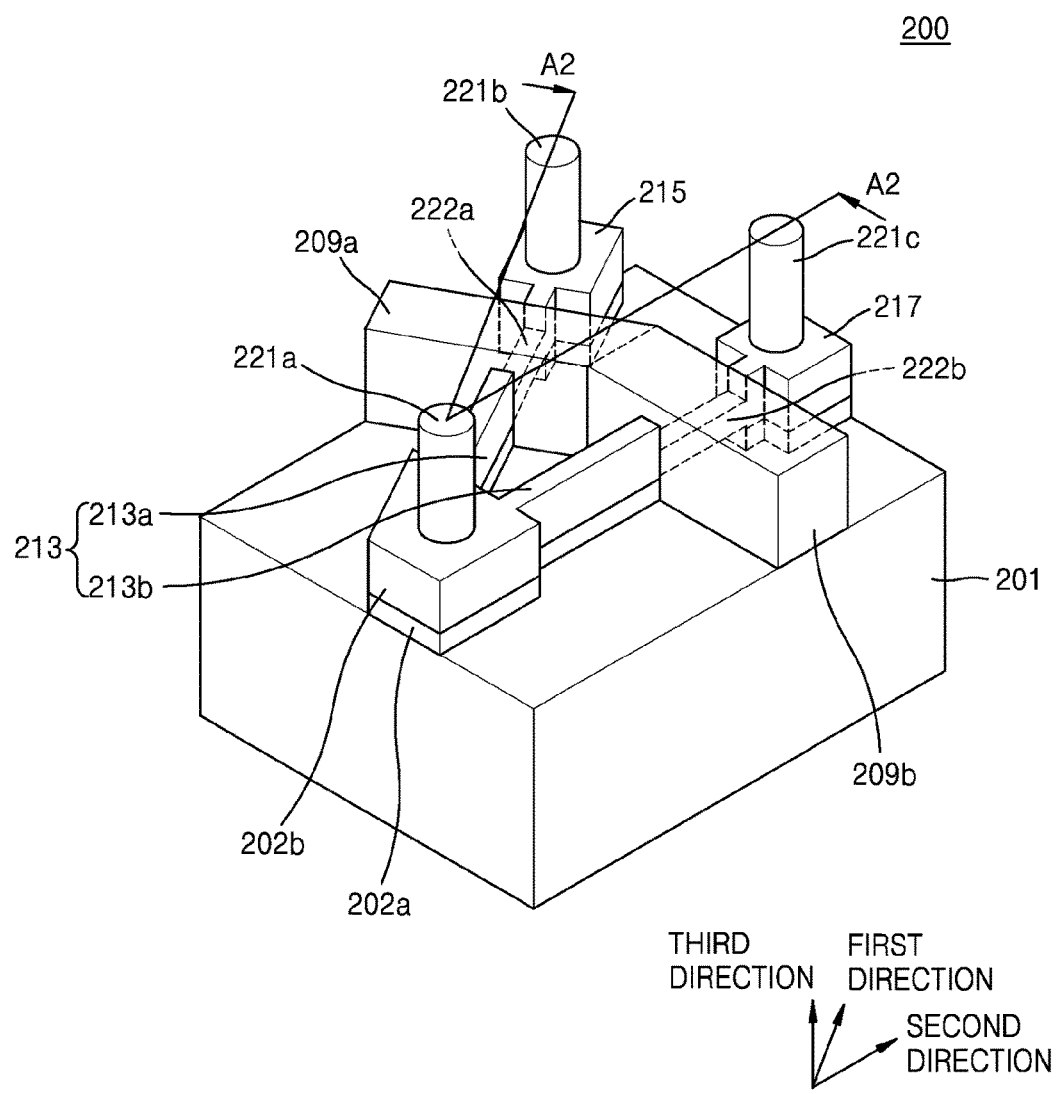
FIG. 11 is a perspective view diagram of a semiconductor device according to aspects of the present inventive concept, wherein a structure of FIG. 11 corresponds to the layout of the semiconductor device of FIG. 1, and a line A2-A2 of FIG. 11 corresponds to the line A-A of FIG. 1.

FIG. 11 is a perspective view diagram of a semiconductor device 200 according to aspects of the present inventive concept. The semiconductor 200 of FIG. 11 has a transistor structure corresponding to the layout of the semiconductor device 10 of FIG. 1 and having a nano-wire channel. First semiconductor patterns 213a, 222a, and 215 and second semiconductor patterns 213b, 222b, and 217 of FIG. 11 may correspond to the first and second active areas AC1 and AC2 of FIG. 1. First and second gate structures 209a and 209b may correspond to the first and second gate structures G1 and G2 of FIG. 1. First, second, and third contact plugs 221a, 221b, and 221c may respectively correspond to the first, second, and third contact plugs C1, C2, and C3 of FIG. 1. A line A2-A2 of FIG. 11 may correspond to the line A-A of FIG. 1.

Figure 12:
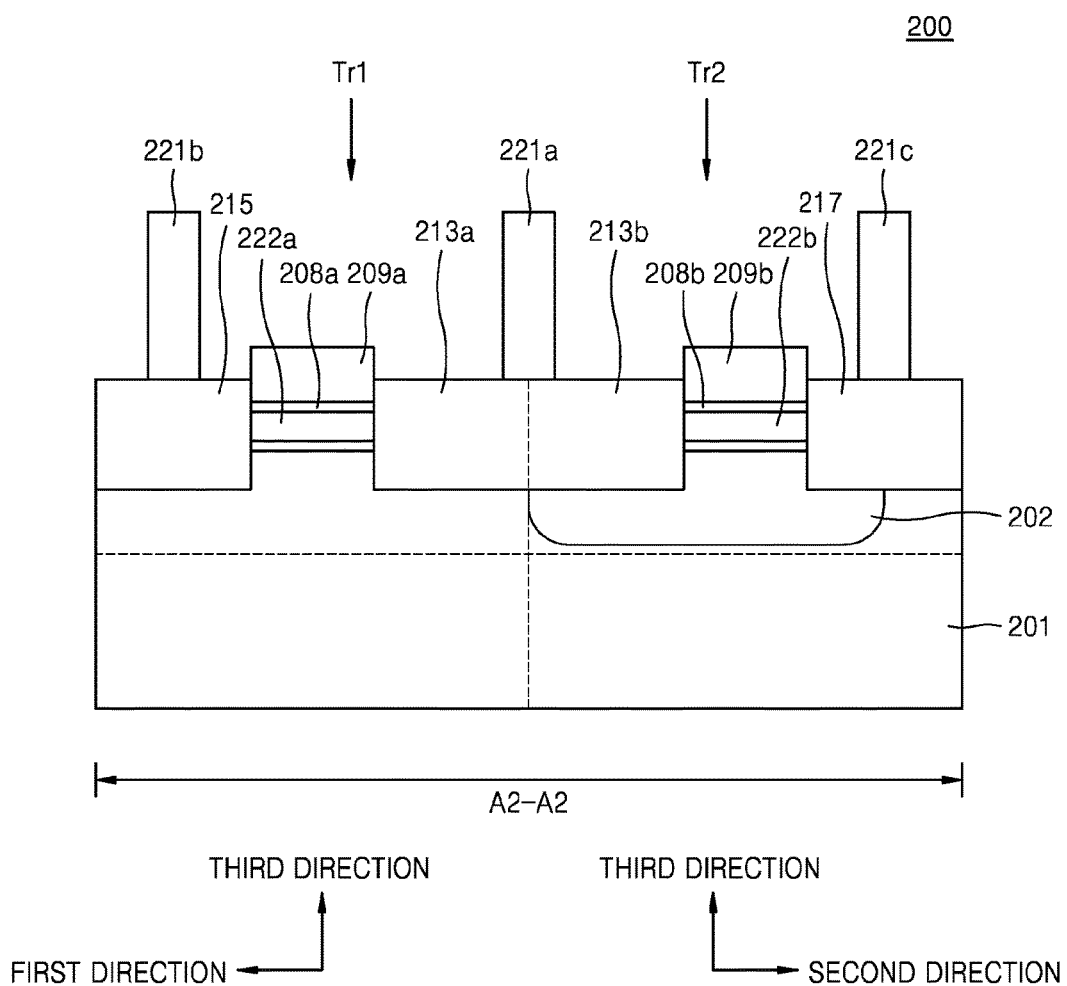
FIG. 12 is a cross-sectional view diagram of a semiconductor device according to aspects of the present inventive concept, wherein a structure of FIG. 12 corresponds to a cross-section taken along the line A2-A2 of FIG. 11.

FIG. 12 is a cross-sectional view diagram of the semiconductor device 200 according to aspects of the present inventive concept and shows a cross-section taken along the line A2-A2 of FIG. 11.

Referring to FIGS. 11 and 12, the semiconductor device 200 may include a substrate 201, the first semiconductor patterns 213a, 222a, and 215, the second semiconductor patterns 213b, 222b, and 217, the first and second gate structures 209a and 209b, and first, second, and third contact plugs 221a, 221b, and 221c. The substrate 201 may include a well 202 in an area facing the second gate structure 209b between the second semiconductor patterns 213b and 217.

The substrate 201 may be formed based on a bulk wafer or an SOI wafer. The substrate 201 includes the same material as the substrate 101 of FIG. 3 and may include an impurity region, or the like which may be formed on the substrate 101.

On the substrate 201, the first semiconductor patterns 213a, 222a, and 215 extending in the first direction, and the second semiconductor patterns 213b, 222b, and 217 extending in the second direction may be for lied. Also, the first semiconductor patterns 213a, 222a, and 215 and the second semiconductor patterns 213b, 222b, and 217 are connected to each other. When a crystalline direction of the substrate 201 is a direction 110 (FIG. 2), the first direction of the first semiconductor patterns 213a, 222a, and 215 may be a direction 100 (FIG. 2), that forms a 45 degree angle with the crystalline direction of the substrate 201. Also, the second direction of the second semiconductor patterns 213b, 222b, and 217 may be the direction 110 that is the same as the crystalline direction of the substrate 201.

The first semiconductor patterns 213a, 222a, and 215 and the second semiconductor patterns 213b, 222b, and 217 may respectively include lower and upper semiconductor layers 202a and 202b. As part of the lower semiconductor layer 202a is etched, first and second nano-wire patterns 222a and 222b that only include the upper semiconductor layer 202b may be formed.

The first nano-wire pattern 222a may overlap the first gate structure 209a on at least one area. The first nano-wire pattern 222a may be spaced apart from an upper surface of the substrate 201. Accordingly, the first gate structure 209a may surround an entire outer surface of the first nano-wire pattern 222a. A portion of the first and second nano-wire patterns 222a and 222b may be an active area where a channel is formed when the portion operates as a transistor. Likewise, the second nano-wire pattern 222b may overlap the second gate structure 209b on at least one area. The second nano-wire pattern 222b may be spaced apart from the upper surface of the substrate 201.

The first semiconductor patterns 213a, 222a, and 215 may include the first and second semiconductor structures 213a and 215 that are respectively connected to both end portions of the first nano-wire pattern 222a. Also, the second semiconductor patterns 213b, 222b, and 217 may include the first and second semiconductor structures 213b and 217 that are respectively connected to both end portions of the second nano-wire pattern 222b. The first and second semiconductor structures 213a and 215 and the first and second semiconductor structures 213b and 217 may contact the upper surface of the substrate 201.

The first gate structure 209a may cross the first nano-wire pattern 222a, and the second gate structure 209b may cross the second nano-wire pattern 222b. First and second gate insulating layers 208a and 208b may be disposed between the first and second nano-wire patterns 222a and 222b and the first and second gate structures 209a and 209b, respectively.

On a first side of each of the first and second gate structures 209a and 209b, the first semiconductor structures 213a and 213b may be a first impurity region doped with first impurities. Also, the second semiconductor structure 215 arranged on the other side of the first gate structure 209a may be a second impurity region doped with second impurities. The first and second impurity regions may be source/drain areas where source/drain voltages are applied to both side portions of the first gate structure 209a. That is, the first semiconductor patterns 213a, 222a, and 215 and the first gate structure 209a may operate as the first transistor Tr1. In this case, the first nano-wire pattern 222a may be a channel area where carriers move.

Also, the second semiconductor structure 217 arranged on the other side of the second gate structure 209b may be a third impurity region doped with third impurities. The first and third impurity regions may be source/drain areas where the source/drain voltages are applied to both side portions of the second gate structure 209b. That is, the second semiconductor patterns 213b, 222b, and 217 and the second gate structure 209b may operate as the second transistor Tr2. In this case, the second nano-wire pattern 222b may be a channel area where carriers move.

Since the first and second transistors Tr1 and Tr2 share the first impurity region functioning as the source/drain areas, a structure of the semiconductor device 200 may be simplified.

The first, second, and third contact plugs 221a, 221b, and 221c for applying the source/drain voltages may be formed on the first, second, and third semiconductor structures 213, 215, and 217, respectively.

Although not shown, an isolation layer that defines the first semiconductor patterns 213a, 222a, and 215 and the second semiconductor patterns 213b, 222b, and 217 may be formed on the substrate 201. Also, an interlayer insulating layer (not shown) may be formed on the isolation layer to fill gaps between the first, second, and third semiconductor structures 213, 215, and 217, the first and second gate structures 209a and 209b, and the first, second, and third contact plugs 221a, 221b, and 221c such that the first, second, and third semiconductor structures 213, 215, and 217, the first and second gate structures 209a and 209b, and the first, second, and third contact plugs 221a, 221b, and 221c may be electrically insulated from each other. However, the descriptions of the interlayer insulating layer are omitted for convenience.

The conductive types of the first to third impurity regions respectively included in the first, second, and third semiconductor structures 213, 215, and 217 are described with reference to FIGS. 4 to 10. That is, the first, second, and third semiconductor structures 213, 215, and 217 may be respectively doped with n-type, n-type, and p-type impurities; n-type, p-type, and p-type impurities; n-type, n-type, and n-type impurities; or p-type, p-type, and p-type impurities, respectively. Also, the first semiconductor structure 213 may not be doped with impurities through an intentional impurity doping process, and the second and third semiconductor structures 215 and 217 may be respectively doped with n-type and p-type impurities.

Figure 13:
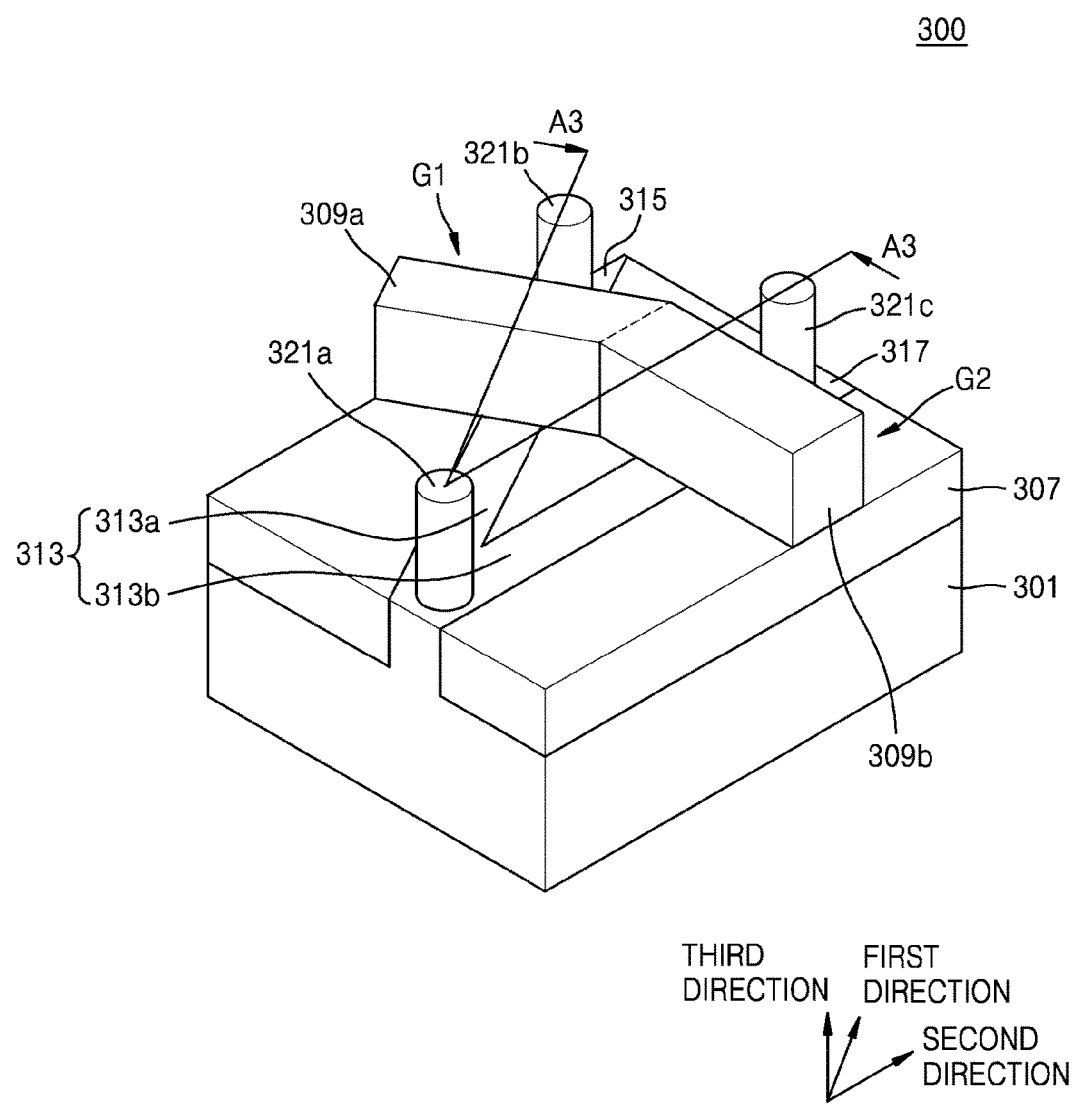
FIG. 13 is a perspective view diagram of a semiconductor device according to aspects of the present inventive concept, wherein a structure of FIG. 13 corresponds to the layout of the semiconductor device of FIG. 1, and a line A3-A3 of FIG. 13 corresponds to the line A-A of FIG. 1.

FIG. 13 is a perspective view diagram of a semiconductor device 300 according to aspects of the present inventive concept. The semiconductor device 300 of FIG. 13 has a planar-type transistor structure corresponding to the layout of the semiconductor device 10 of FIG. 1. A first active area of FIG. 13 including first and second impurity regions 313 and 315 and extending in a first direction may correspond to the first active area AC1 of FIG. 1, and a second active area of FIG. 13 including the first impurity region 313 and a third impurity region 317 and extending in a second direction may correspond to the second active area AC2 of FIG. 1. In this case, the first impurity region 313 includes a first impurity region 313a extending in the first direction and a second impurity region 313b extending in the second direction.

First and second gate structures G1 (308a, 309a) and G2 (308b, 309b) of FIG. 13 may correspond to the first and second gate structures G1 and G2 of FIG. 1. First, second, and third contact plugs 321a, 321b, and 321c of FIG. 13 may correspond to the first, second, and third contact plugs C1, C2, and C3 of FIG. 1, respectively. A line A3-A3 of FIG. 13 corresponds to the line A-A of FIG. 1.

Figure 14:
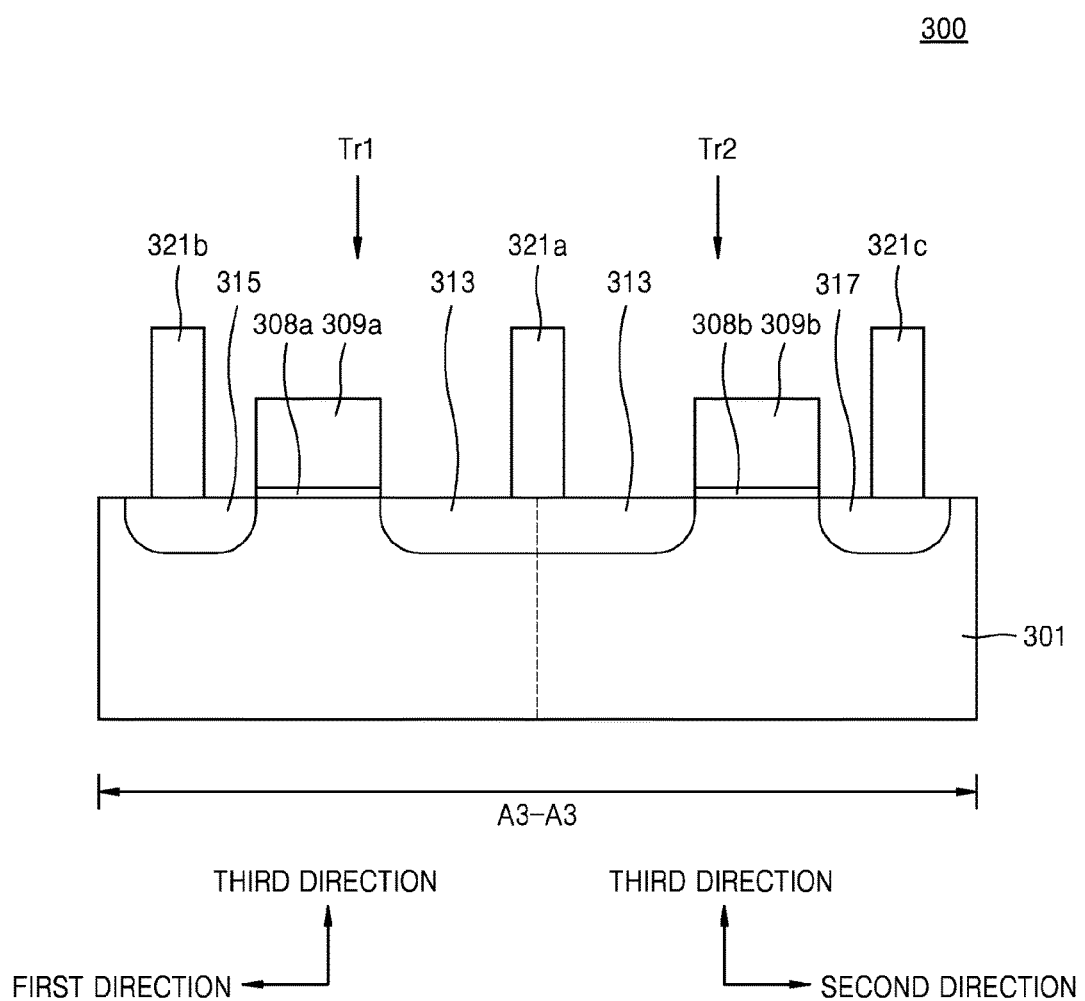

FIG. 14 is a cross-sectional view diagram of the semiconductor device 300 according to aspects of the present inventive concept. FIG. 14 shows a cross-section taken along the line A3-A3 of FIG. 13.

Referring to FIGS. 13 and 14, a substrate 301 may include the first active area extending in the first direction and the second active area extending in the second direction and connected to the first active area. The first and second active areas may be defined by an isolation layer 307.

The first and second gate structures G1 and G2 cross the first and second active areas, respectively. The first and second gate structures G1 and G2 may sequentially include gate insulating layers 308a and 308b and gate electrode layers 309a and 309b.

The first and second active areas located on first sides of the first and second gate structures G1 and G2 may form a first impurity region 313. Also, the first active area located on the other sides of the first gate structure G1 may form a second impurity region 315. The second active area located on the other sides of the second gate structure G2 may form a third impurity region 317.

The first and second impurity regions 313 and 315 may be source/drain areas where source/drain voltages are applied to both side portions of the first gate structure G1. That is, the first and second impurity regions 313 and 315 and the first gate structure G1 may operate as a first transistor Tr1. Also, the first and third impurity regions 313 and 317 may be source/drain areas where source/drain voltages are applied to both side portions of the second gate structure G2. That is, the first and third impurity regions 313 and 317 and the second gate structure G2 may operate as a second transistor Tr2.

Conductive types of the first, second, and third impurity regions 313, 315, and 317 are as described with reference to FIGS. 4 to 10. That is, the first, second, and third impurity regions 313, 315, and 317 may be respectively doped with n-type, n-type, and p-type impurities; n-type, p-type, and p-type impurities; n-type, n-type, and n-type impurities; or p-type, p-type, and p-type impurities. Also, the first impurity region 313 may not be doped with impurities through an intentional impurity doping process, and the second and third impurity regions 315 and 317 may be respectively doped with n-type and p-type impurities.

The first, second, and third contact plugs 321a, 321b, and 321c for applying the source/drain voltages may be formed on the first, second, and third impurity regions 313, 315, and 317, respectively.

Since the first and second transistors Tr1 and Tr2 share the first impurity region 313 functioning as the source/drain areas, a structure of the semiconductor device 300 may be simplified.

Figure 15:
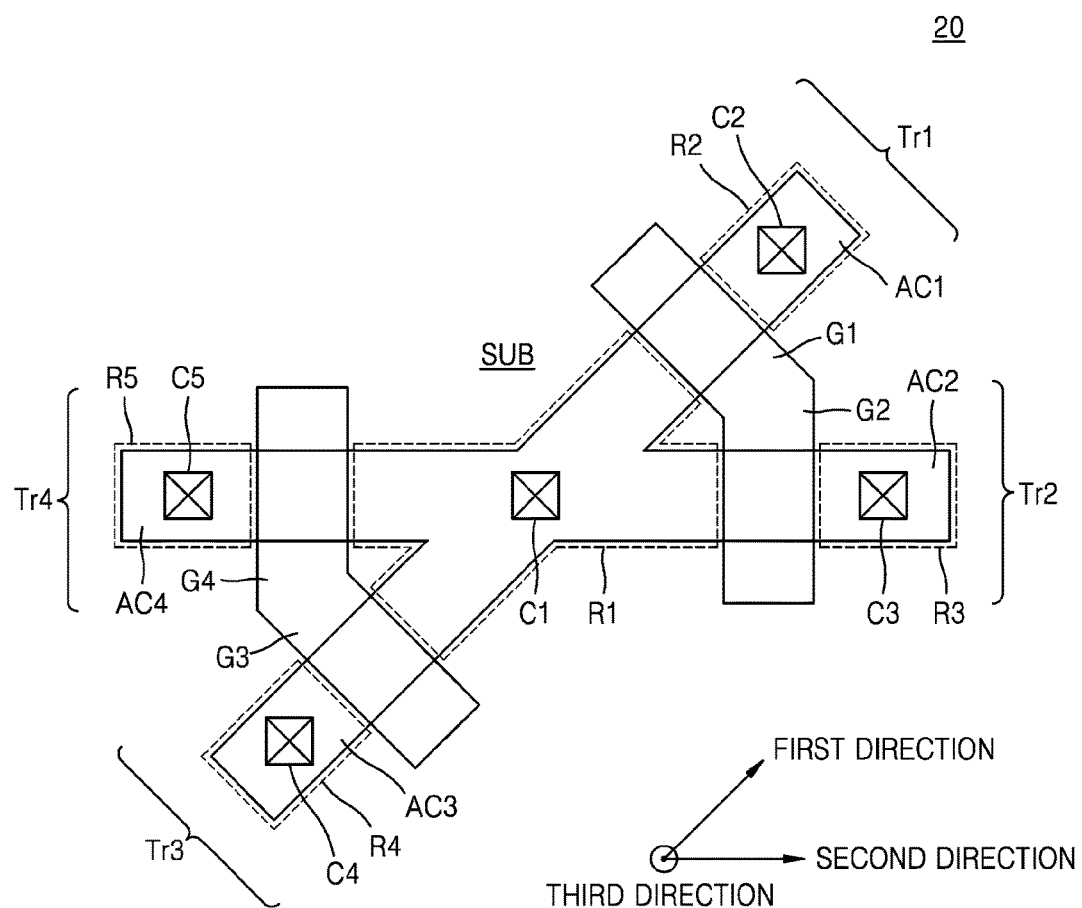
FIG. 15 is a schematic layout diagram of a semiconductor device according to aspects of the present inventive concept.

FIG. 15 is a schematic layout of a semiconductor device 20 according to aspects of the present inventive concept. The semiconductor device 20 of FIG. 15 is similar to the semiconductor device 10 of FIG. 1, but is different therefrom because the semiconductor device 20 further includes third and fourth active areas AC3 and AC4 respectively extending in first and second directions, and third and fourth gate structures G3 and G4.

Referring to FIG. 15, the semiconductor device 20 may include a first active area AC1 extending in the first direction and a second active area AC2 extending in the second direction and connected to the first active area AC1. Also, the semiconductor device 20 may further include the third active area AC3 connected to an area where the first and second active areas AC1 and AC2 are connected to each other, and further extending in the first direction. Also, the semiconductor device 20 may further include the fourth active area AC4 connected to an area where the first to third active areas AC1 to AC3 are connected to each other, and further extending in the second direction.

The first to fourth active areas AC1 to AC4 may be defined by an isolation layer (not shown). The first and second active areas AC1 and AC2 may have various structures such as a fin-type structure, a structure including a nano-wire channel, or a planar-type structure.

In this case, a crystalline direction of a substrate SUB on which the first to fourth active areas AC1 to AC4 are formed may be a direction 110 (FIG. 2). Also, the second direction of the second and fourth active areas AC2 and AC4 may be the direction 110 that is the same as the crystalline direction of the substrate SUB, and the first direction of the first and third active areas AC1 and AC3 may be a direction 100 (FIG. 2) that forms a 45 degree angle with the second direction.

On the substrate SUB, the first and second gate structures G1 and G2 respectively crossing the first and second active areas AC1 and AC2 and the third and fourth gate structures G3 and G4 respectively crossing the third and fourth active areas AC3 and AC4 may be formed. The first and second gate structures G1 and G2 may be connected to each other, and the third and fourth gate structures G3 and G4 may be connected to each other. Also, the first to fourth gate structures G1 to G4 may optionally be connected to each other. Thus, the first and fourth gate structures G1 and G4 may be connected to each other, and the second and third gate structures G2 and G3 may be connected to each other. In other words, the first to fourth G1 to G4 may be a shape of quadrangle.

On sides of the first to fourth gate structures G1 to G4, the first impurity region R1 may be formed in an area where the first to fourth active area AC1 to AC4 are connected to each other. Also, on the other sides of the first to fourth gate structures G1 to G4, second to fifth impurity regions R2 to R5 may be respectively formed in the first to fourth active area AC1 to AC4. The first to fifth impurity regions R1 to R5 may function as source/drain areas.

In this case, depending on whether the first to fifth impurity regions R1 to R5 form an n-type transistor or a p-type transistor, conductive types of the first to fifth impurity regions R1 to R5 may be determined. In some embodiments, the first impurity region R1 may be doped with n-type impurities, and the second and fourth impurity regions R2 and R4 may be doped with impurities of the same type as impurities doping the first impurity region R1. Also, the third and fifth impurity regions R3 and R5 may be doped with p-type impurities.

In this case, in an area including the first and second impurity regions R1 and R2 and an area including the first and fourth impurity regions R1 and R4, a carrier moves in the direction 100, performance of the n-type transistor may be optimized. Also, in an area including the first and third impurity regions R1 and R3 and an area including the first and fifth impurity regions R1 and R5, since a carrier moves in the direction 110, performance of the p-type transistor may be optimized. Also, since the p-type transistor shares the first impurity region R1 as the source/drain areas, an amount of current may be doubled.

In other aspects of the present inventive concept, the first to fifth impurity regions R1 to R5 may be doped with impurities of the same type, that is, either n-type impurities or p-type impurities. For example, when all of the first to fifth impurity regions R1 to R5 are doped with n-type impurities, the carrier moves in the direction 100 in the area including the first and second impurity regions R1 and R2 and the area including the first and fourth impurity regions R1 and R4, and thus, an n-type transistor operating at high speed may be formed. Also, the carrier moves in the direction 110 in the area including the first and third impurity regions R1 and R3 and the area including the first and fifth impurity regions R1 and R5, an n-type transistor operating at low speed may be formed. When all of the first to fifth impurity regions R1 to R5 are doped with p-type impurities, p-type transistors operating at high speed and low speed may be formed in opposite locations.

FIGS. 16A to 16G are perspective view diagrams in a process order for illustrating a method of manufacturing a semiconductor device, according to aspects of the present inventive concept.

Figure 16A:
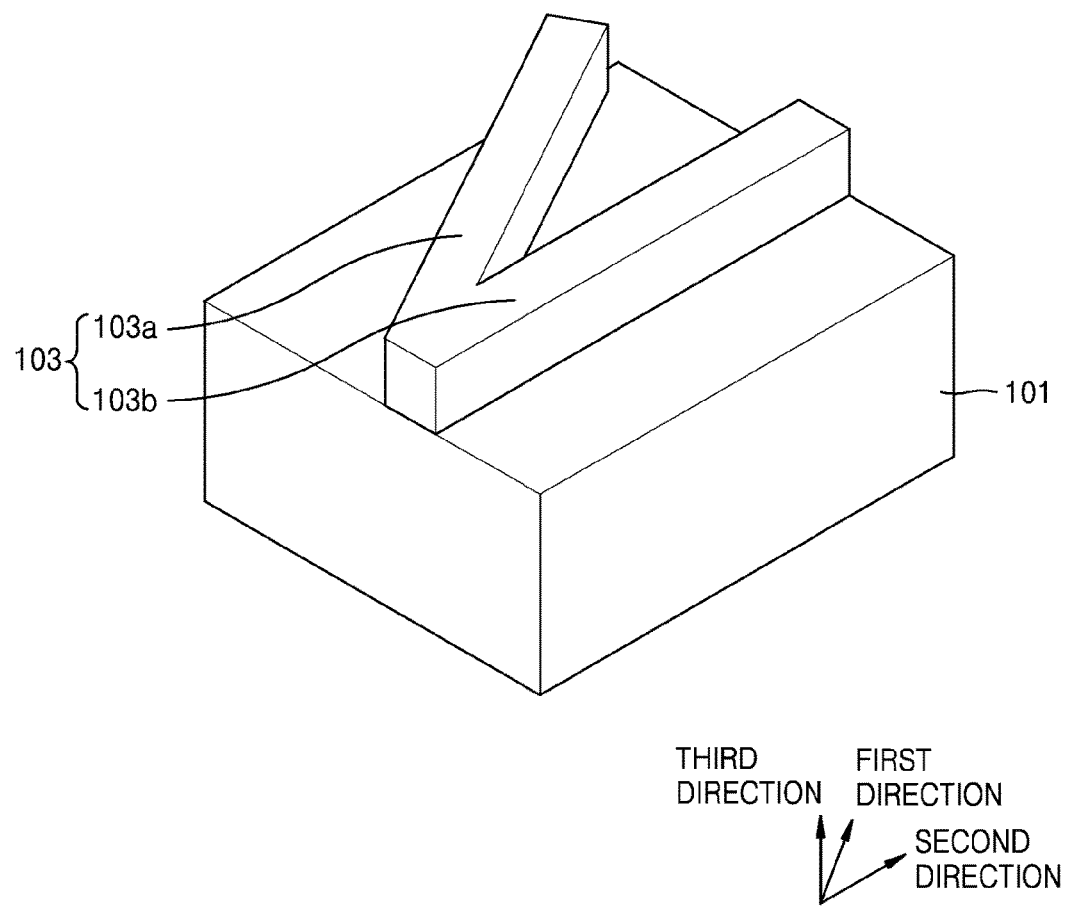
FIGS. 16a to 16g are perspective view diagrams in a process order for illustrating a method of manufacturing a semiconductor device, according to aspects of the present inventive concept.

Referring to FIG. 16A, a mask pattern 103 may be formed on the substrate 101. In this case, the mask pattern 103 may include first and second mask patterns 103a and 103b respectively extending in first and second directions.

Figure 16B:
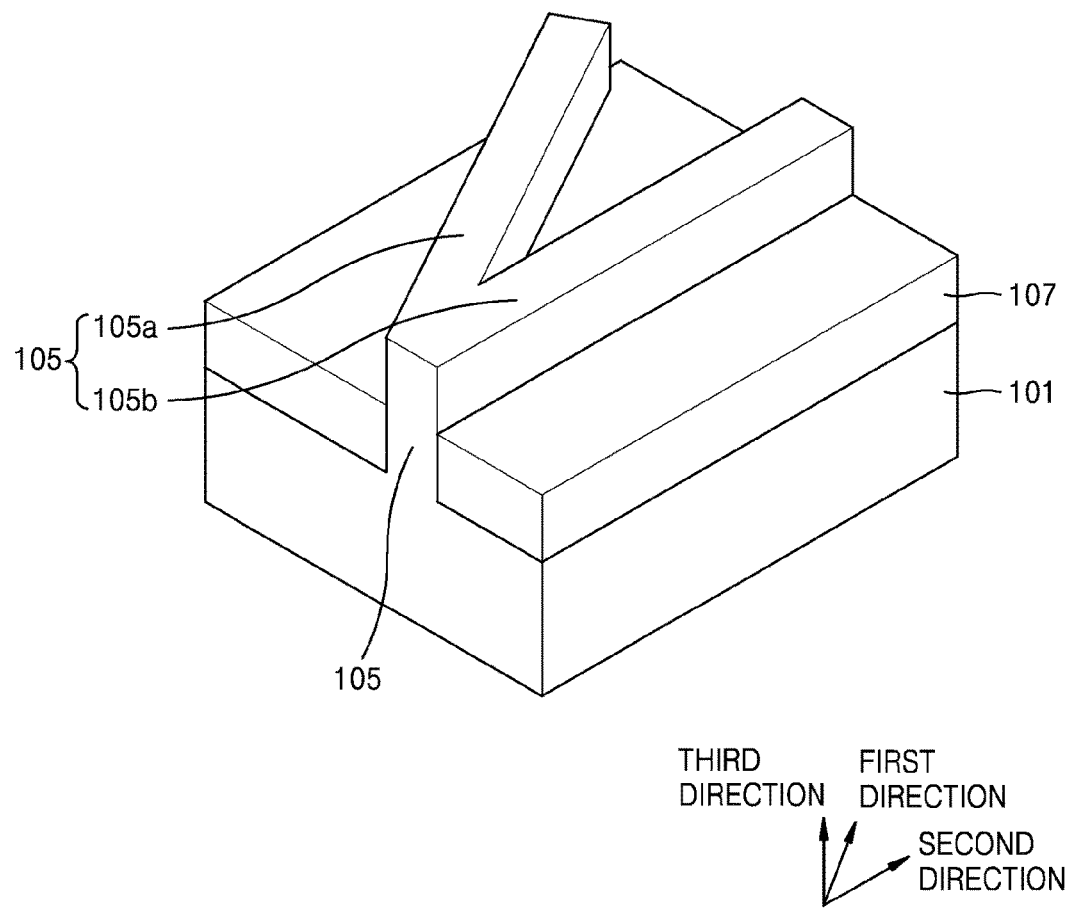
Figure 16C:
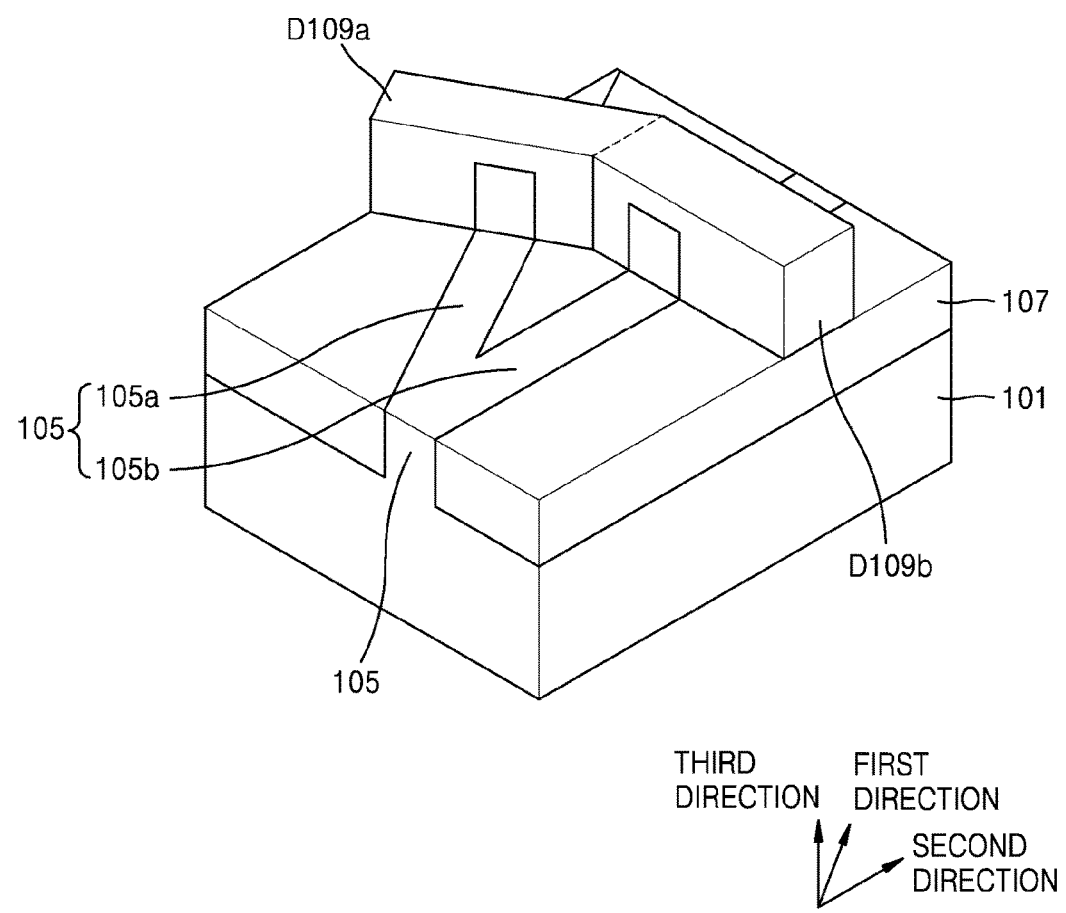

Referring to FIG. 16B, by using the mask pattern 103 as an etching mask, the substrate 101 may be etched, and then the first and second fin-type structures 105a and 105b may be formed. A trench may be formed between the first and second fin-type structures 105a and 105b, and the isolation layer 107 filling the trench may be formed.

Then, an upper portion of the isolation layer 107 may be recessed, and upper surfaces of the first and second fin-type structures 105a and 105b may be exposed. A recess process may include a selective etching process. The mask pattern 103 of FIG. 16A may be removed before the isolation layer 107 is formed or after the recess process. Portions of the first and second fin-type structures 105a and 105b protruding toward the isolation layer 107 may be formed through an epitaxial process. That is, the portions of the first and second fin-type structures 105a and 105b may be formed through the epitaxial process by using, as seeds, the upper surfaces of the first and second fin-type structures 105a and 105b that are exposed to the isolation layer 107 without performing the recess process.

Then, a doping process may be performed to adjust a threshold voltage applied to the first and second fin-type structures 105a and 105b. In this case, when the first and/or second fin-type structures 105a and 105b form an n-type transistor, the first and/or second fin-type structures 105a and 105b may be doped with n-type impurities. Also, when the first and/or second fin-type structures 105a and 105b form a p-type transistor, the first and/or second fin-type structures 105a and 105b may be doped with p-type impurities.

Referring to FIG. 16C, depending on a result shown in FIG. 16B, first and second dummy gate structures D109a and D109b crossing the first and second fin-type structures 105a and 105b may be formed. The first and second dummy gate structures D109a and D109b may include materials having an etching selection ratio with respect to an interlayer insulating layer formed after the first and second dummy gate structures D109a and D109b are formed. Spacers (not shown) may be respectively formed on side walls of the first and second dummy gate structures D109a and D109b. Then, recesses may be formed by partially removing the first and second fin-type structures 105a and 105b exposed to the sides of the first and second dummy gate structures D109a and D109b. Accordingly, the first and second fin-type structures 105a and 105b may include protrusions, which are formed in an area where the first and second dummy gate structures D109a and D109b overlap the first and second fin-type structures 105a and 105b, respectively, with base portions formed on the sides of the first and second dummy gate structures D109a and D109b.

Figure 16D:
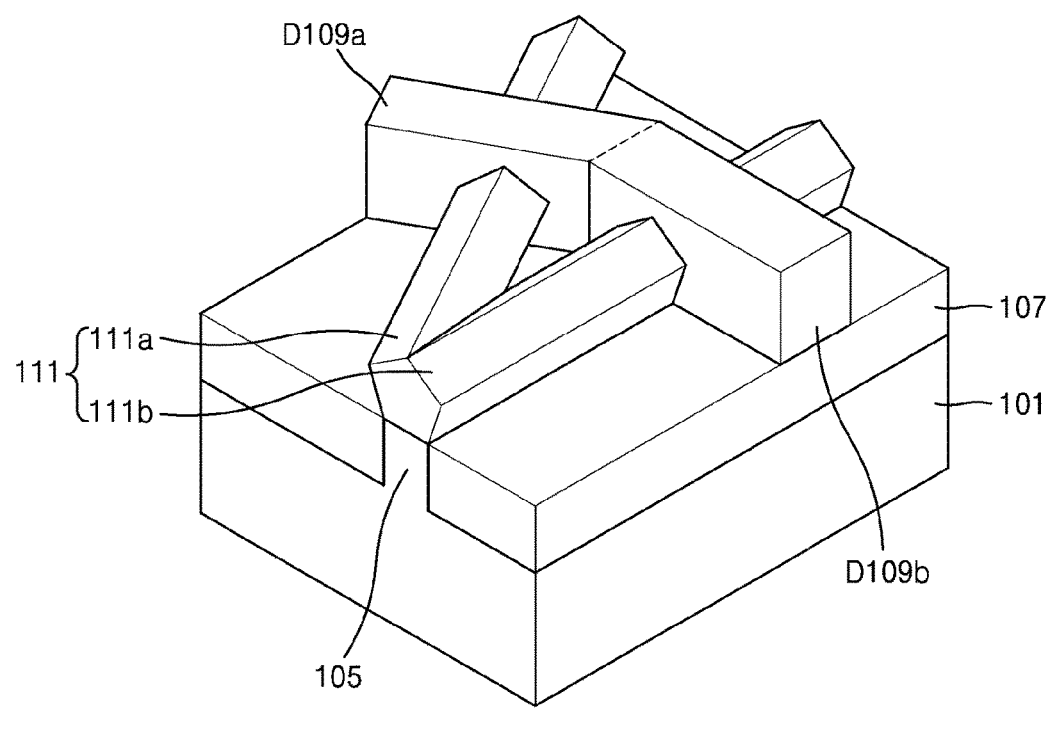

Referring to FIG. 16D, a growth layer 111 may be formed on the base portions of the first and second fin-type structures 105a and 105b that are exposed to the sides of the first and second dummy gate structures D109a and D109b. The growth layer 111 may include a first preliminary growth layer 111a formed on the base portion of the first fin-type structure 105a and a second preliminary growth layer 111b formed on the base portion of the second fin-type structure 105b.

Figure 16E:
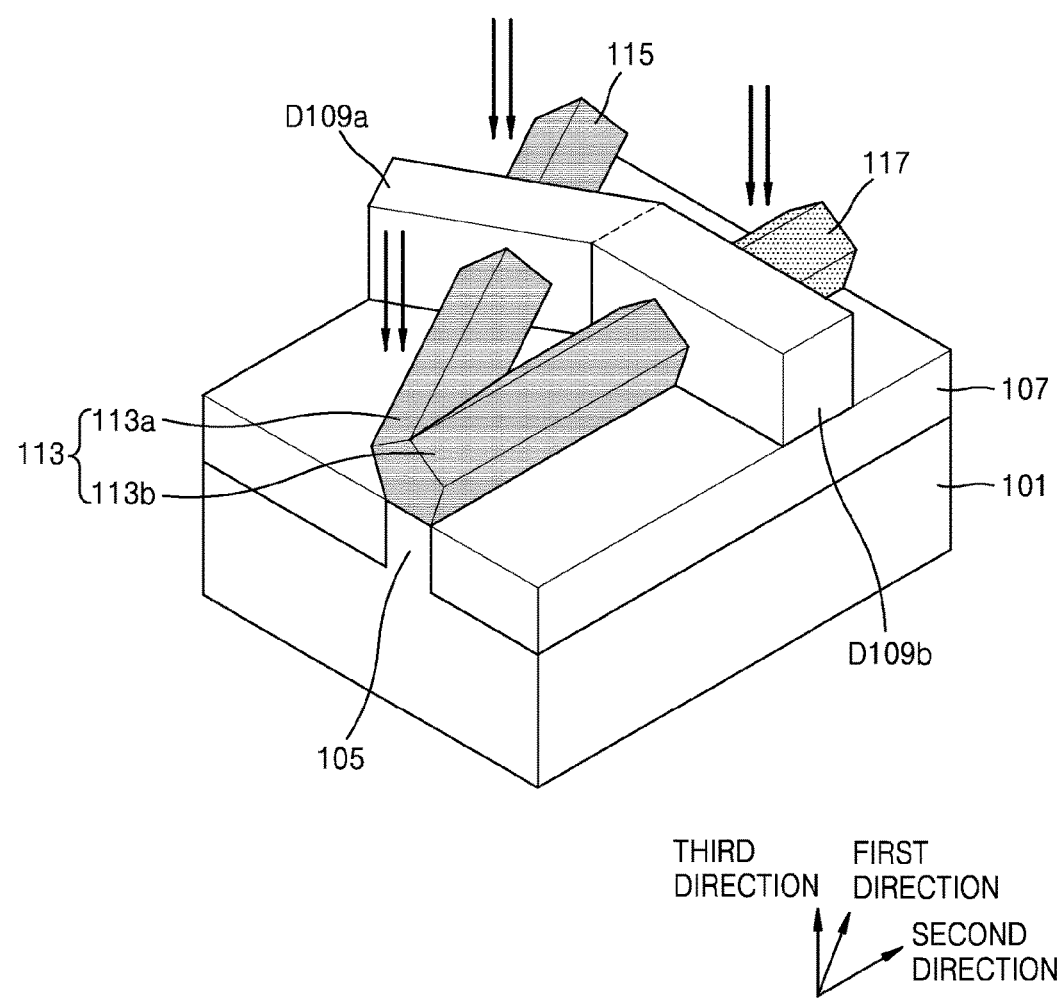

Referring to FIG. 16E, depending on whether the first and/or second fin-type structures 105a and 105b form an n-type transistor or a p-type transistor, the first and second preliminary growth layers 111a and 111b of FIG. 16D are doped with impurities, and thus, the first, second, and third growth layers 113, 115, and 117 including impurity regions may be formed.

On sides of the first and second dummy gate structures D109a and D109b, an area where the first and second preliminary growth layers 111a and 111b are connected to each other may be doped with first impurities. Therefore, the first growth layer 113 including a first impurity region may be formed on the area where the first and second preliminary growth layers 111a and 111b are connected to each other. Also, the second growth layer 115 including a second impurity region may be formed on the first preliminary growth layer 111a formed on the other side of the first dummy gate structure D109a. The second preliminary growth layer 111b formed on the other side of the second dummy gate structure D109b may include a third impurity region.

Before the first and second preliminary growth layers 111a and 111b are formed, the base portions of the first and second fin-type structures 105a and 105b are doped with impurities such that impurity regions may be formed. In this case, the first, second, and third growth layers 113, 115, and 117 may have different conductive types, depending on the impurities doping the base portions of the first and second fin-type structures 105a and 105b. In this case, a process via which the first and second preliminary growth layers 111a and 111b are doped with impurities may not be performed.

Figure 16F:
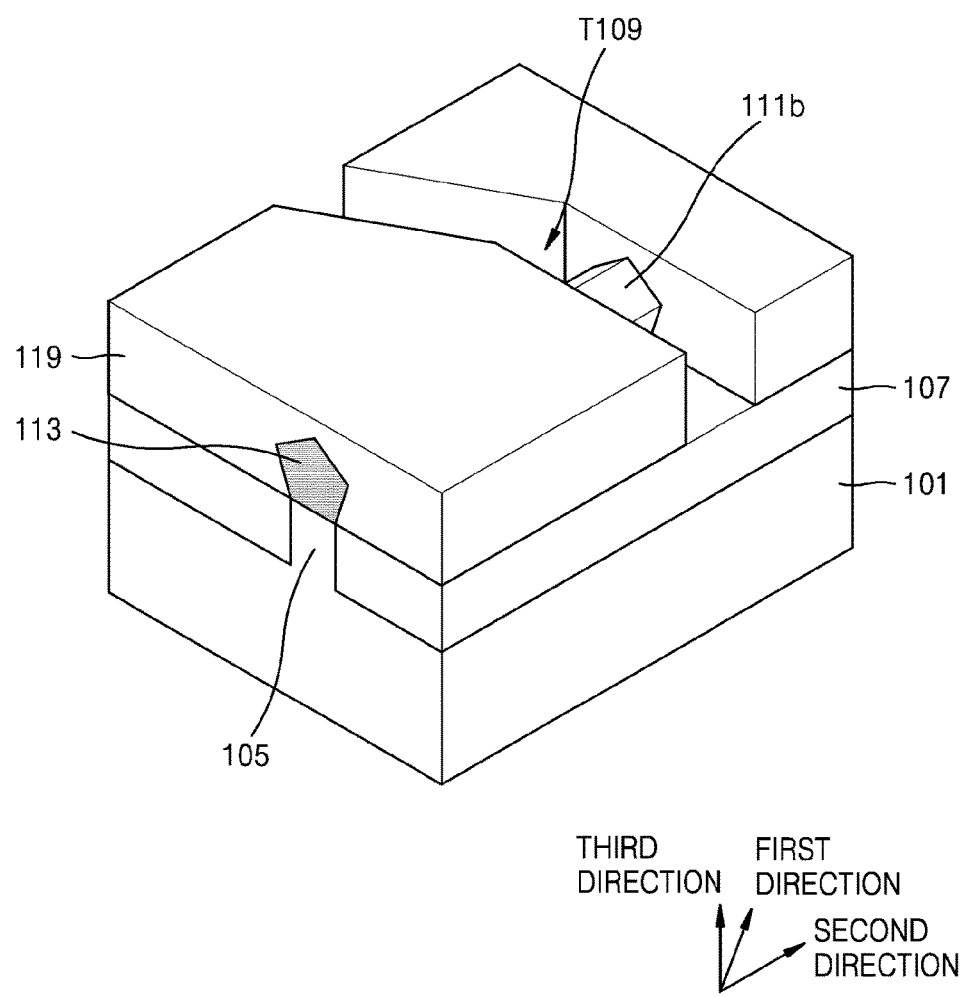

Referring to FIG. 16F, an interlayer insulating layer 119 may be formed on a result shown in FIG. 16E. Then, until upper surfaces of the first and second dummy gate structures D109a and D109b are exposed, the interlayer insulating layer 119 may be planarized.

The first and second dummy gate structures D109a and D109b of FIG. 16E that are exposed may be removed. Accordingly, a trench T109 exposing the isolation layer 107 may be formed.

Figure 16G:
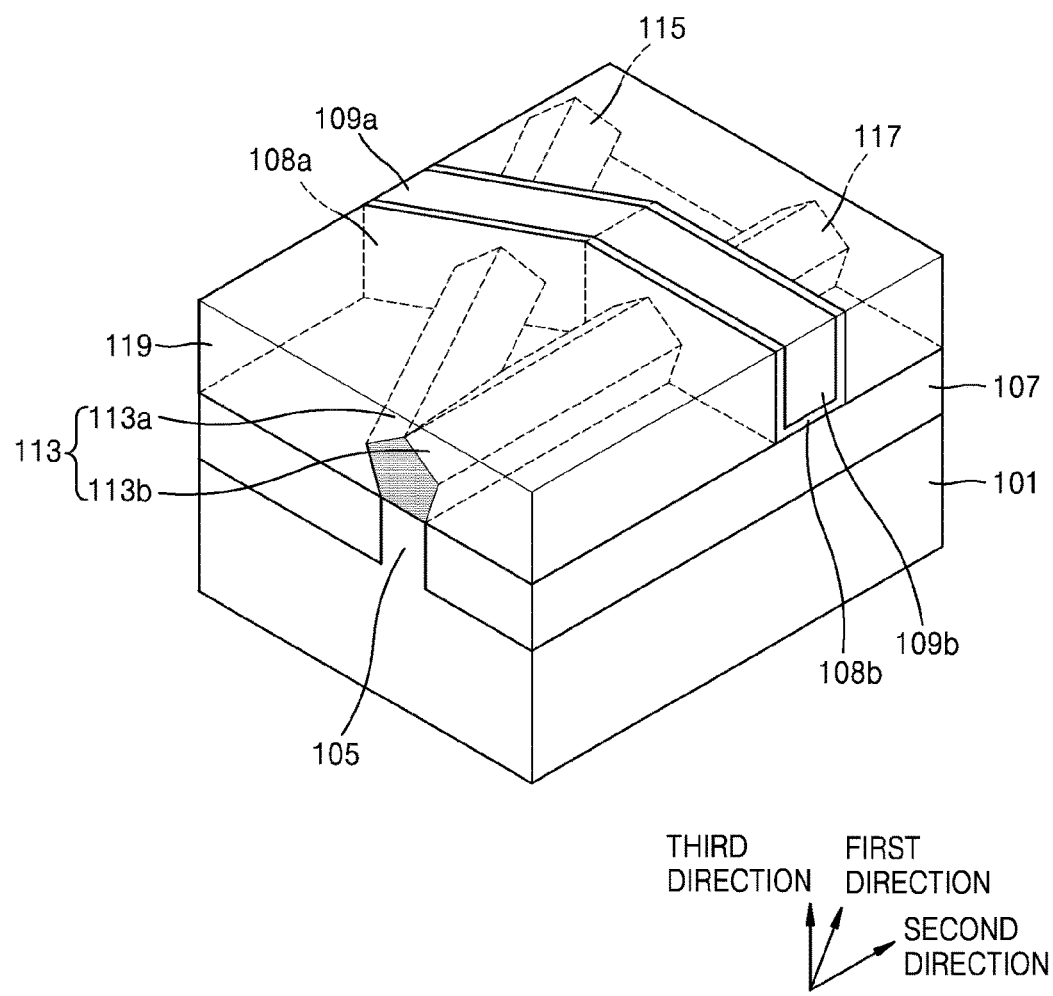

Referring to FIG. 16G, first and second gate insulating layers 108a and 108b may be formed to conformally cover inner side surfaces and a lower surface of the trench T109 of FIG. 16F. Then, first and second gate electrode layers 109a and 109b may be formed on the first and second gate insulating layers 108a and 108b in order to fill the trench T109.

The first and second gate insulating layers 108a and 108b and the first and second gate electrode layers 109a and 109b are planarized so that they remain only on the trench T109 of FIG. 16F, and thus, the first and second gate structures G1 and G2 may be formed.

Referring FIG. 3 together, an additional interlayer insulating layer (not shown) may be formed on the isolation layer 107 and the first and second gate structures G1 and G2. First to third contact holes (not shown) exposing upper surfaces of the first, second, and third growth layers 113, 115, and 119 may be formed. The first, second, and third contact plugs 121a, 121b, and 121c are formed by filling the first to third contact holes, and thus the semiconductor device 100 may be manufactured.

FIGS. 17A to 17F are perspective view diagrams in a process order for illustrating a method of manufacturing a semiconductor device, according to aspects of the present inventive concept.

Figure 17A:
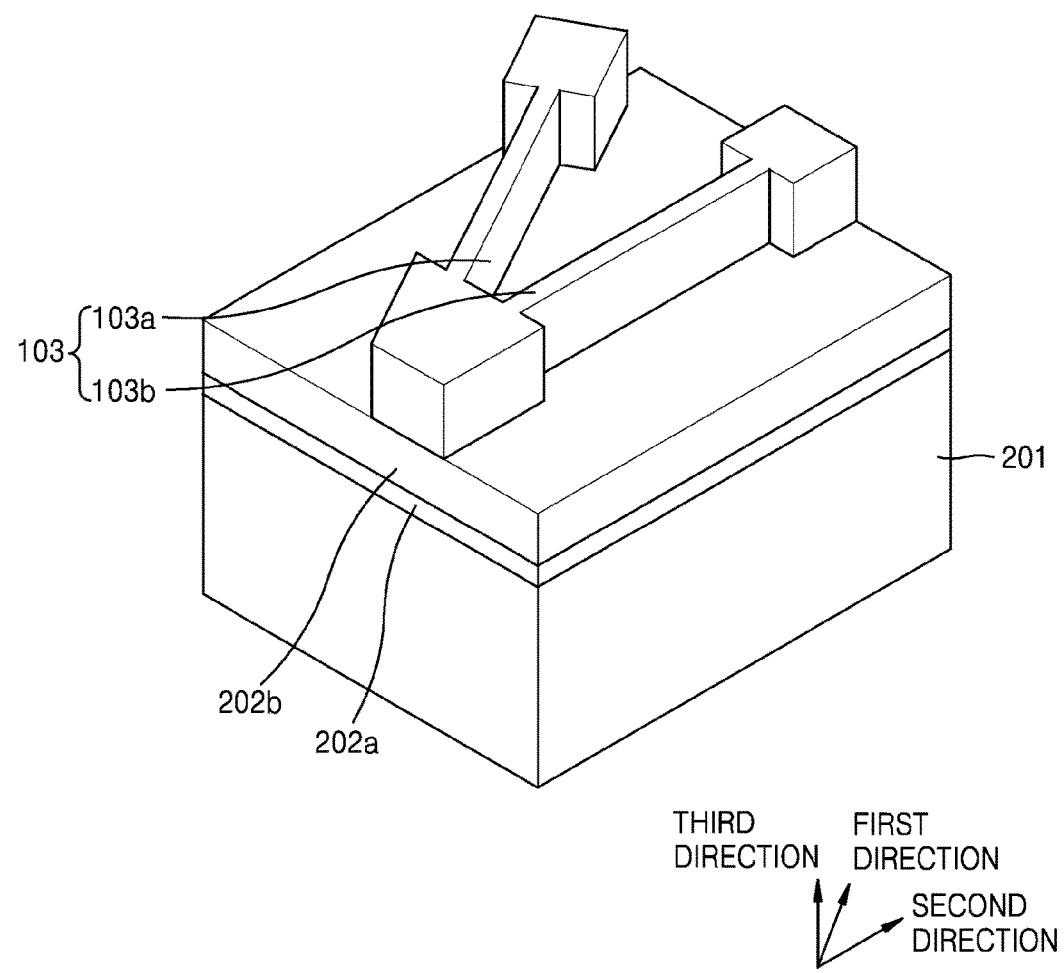
FIGS. 17a to 17f are perspective view diagrams in a process order for illustrating a method of manufacturing a semiconductor device, according to aspects of the present inventive concept.

Referring to FIG. 17A, first and second semiconductor layers 202a and 202b may be formed on the substrate 201. The first semiconductor layer 202a may include a first semiconductor material such as SiGe. The first and second semiconductor layers 202a and 202b may be formed on the substrate 201 through epitaxial growth.

A thickness of the first semiconductor layer 202a may be used to determine a distance between an upper surface of the substrate 201 and first and second nano-wire patterns 222a and 222b of FIG. 11, which are formed through a subsequent process performed on the substrate 201. Therefore, the thickness of the first semiconductor layer 202a may be determined by taking the distance into account. The second semiconductor layer 202b is etched during the following process, and then the first and second nano-wire patterns 222a and 222b of FIG. 11 may be formed.

The first and second mask patterns 103a and 103b that respectively define the first semiconductor patterns 213a, 222a, and 215 and the second semiconductor patterns 213b, 222b, and 217 of FIG. 3 may be formed on the second semiconductor layer 202b.

Figure 17B:
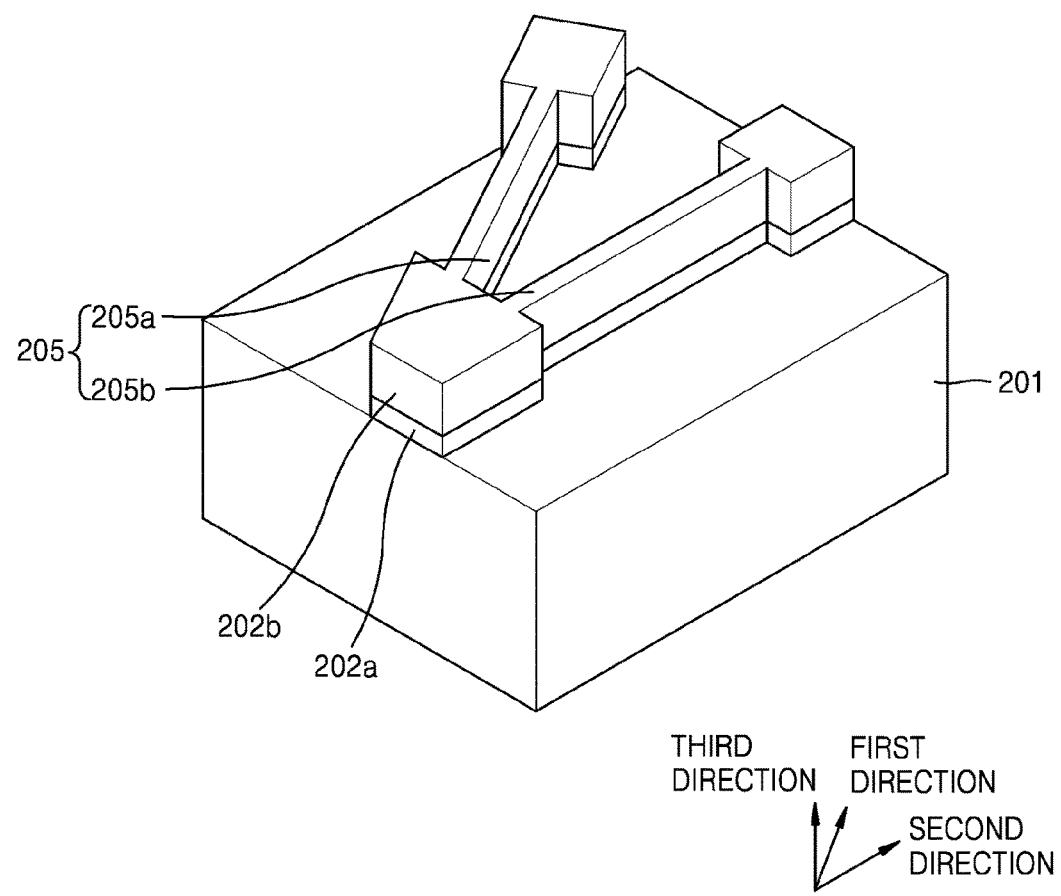

Referring to FIG. 17B, patterning may be performed for the first and second semiconductor layers 202a and 202b by using the first and second mask patterns 103a and 103b of FIG. 17A as etching masks. Accordingly, a semiconductor pattern 205 includes a first semiconductor pattern 205a extending in a first direction and a second semiconductor pattern 205b extending in a second direction may be formed on the substrate 201. The first and second semiconductor patterns 205a and 205b are connected to each other. The first and second semiconductor patterns 205a and 205b may have a structure in which the first and second semiconductor layers 202a and 202b are stacked.

Figure 17C:
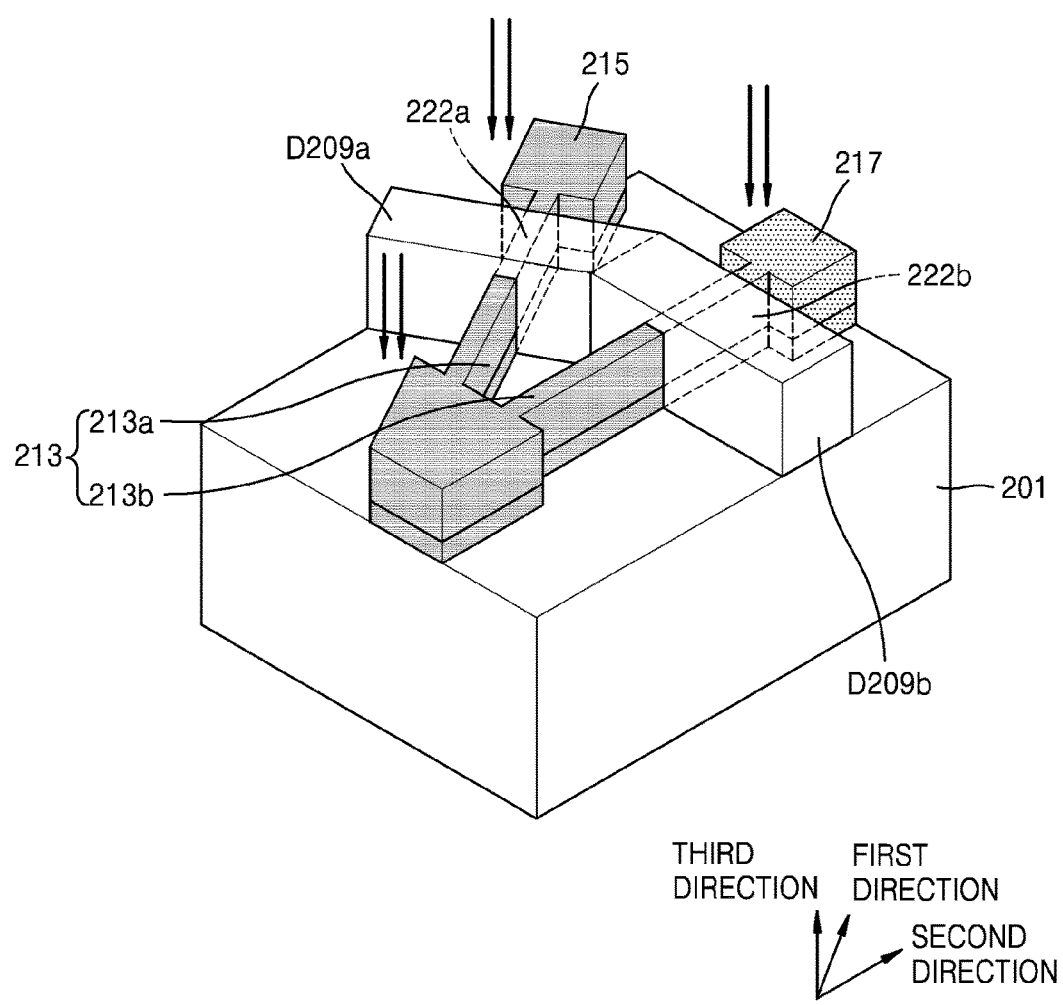

Referring to FIG. 17C, first and second dummy gate structures D209a and D209b, which respectively cross the first and second semiconductor layers 202a and 202b of FIG. 17B, may be formed. Spacers (not shown) may be respectively formed on side walls of the first and second dummy gate structures D209a and D209b.

The first and second semiconductor layers 202a and 202b of FIG. 17B, which are exposed to the side walls of the first and second dummy gate structures D209a and D209b, are doped with impurities to thereby form an impurity region. Depending on whether the first and/or second semiconductor layers 202a and 202b of FIG. 17B form an n-type transistor or a p-type transistor, conductive types of the impurities may be selected.

An area where the first and second semiconductor patterns 205a and 205b are connected to each other may be doped with first impurities on first sides of the first and second dummy gate structures D209a and D209b. First and second semiconductor patterns 213a and 213b doped with the first impurities may form a first semiconductor structure 213 including a first impurity region. Also, on the other side of the first dummy gate structure D209a, the first semiconductor pattern 205a of FIG. 17B may be doped with second impurities. Accordingly, the second semiconductor structure 215 may include a second impurity region. On the other side of the second dummy gate structure D209b, the second semiconductor pattern 205b of FIG. 17B may be doped with third impurities. Accordingly, the third semiconductor structure 217 may include a third impurity region.

Figure 17D:
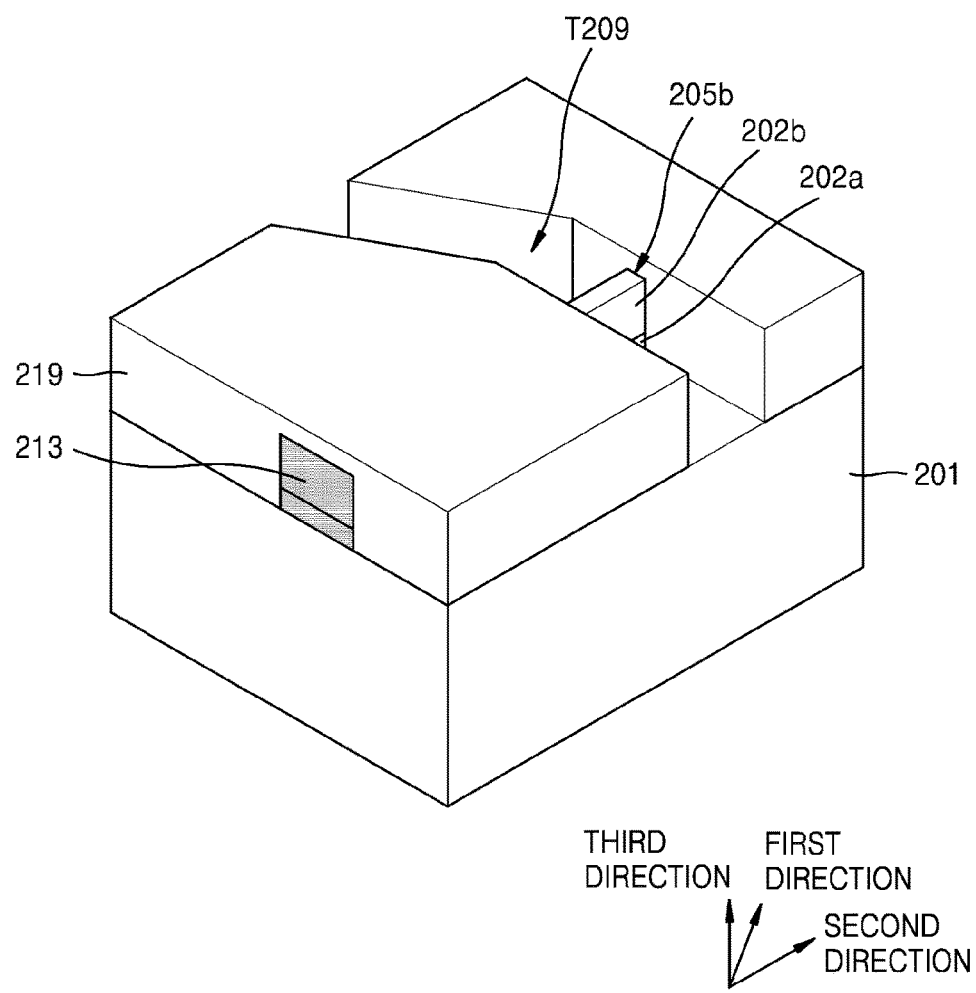

Referring to FIG. 17D, an interlayer insulating layer 219 that covers the substrate 201, the first, second, and third semiconductor structures 213, 215, and 217, and the first and second dummy gate structures D209a and D209b is formed. Then, until upper surfaces of the first and second dummy gate structures D209a and D209b of FIG. 17C are exposed, the interlayer insulating layer 219 may be planarized. A trench T209 may be formed by removing the first and second dummy gate structures D209a and D209b of FIG. 17C. Through the trench T209, portions of the first semiconductor pattern and the second semiconductor patterns 222b may be exposed.

Figure 17E:
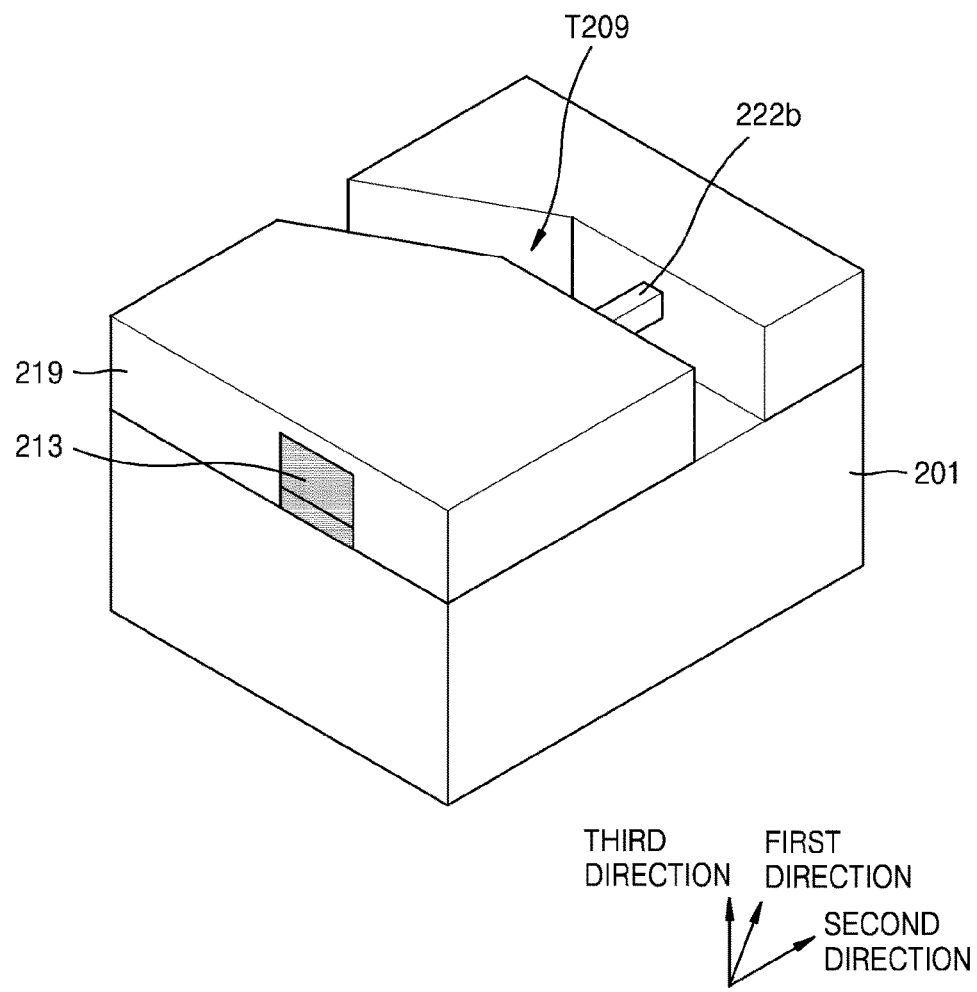

Referring to FIGS. 11 and 17E, the first semiconductor layer 202a that is stacked under the first and second semiconductor patterns 205a and 205b of FIGS. 17B and 17D, portions of which are exposed through the trench T209, may be selectively removed. Since the first semiconductor layer 202a is partially removed, the second semiconductor pattern 202b of FIG. 17D may be only left. The removal may be performed through an isotropic etching process, and part of an external surface of the second semiconductor pattern 202b of FIG. 17D is etched through the isotropic etching process such that the first and second nano-wire patterns 222a and 222b that are spaced apart from the upper surface of the substrate 201 may be formed.

Figure 17F:
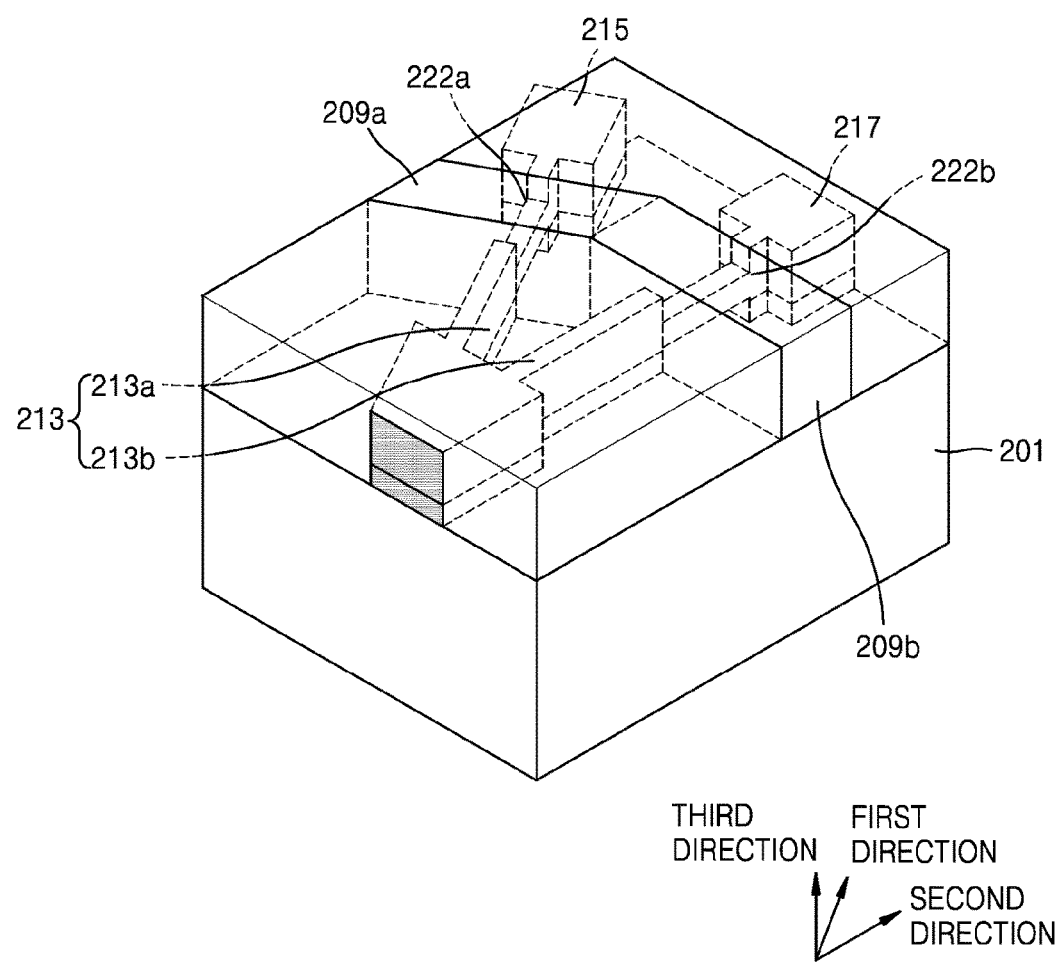

Referring to FIG. 17F, a gate electrode material may be formed to fill the trench T209 of FIG. 17E. The gate electrode material may be planarized to be left only in the trench T209, and the first and second gate structures 209a and 209b may be formed.

Referring to FIGS. 11 and 17F, an additional interlayer insulating layer (not shown) may be formed on the interlayer insulating layer 219 and the first and second gate structures 209a and 209b. The first, second, and third contact plugs 221a, 221b, and 221c that are respectively connected to the first, second, and third semiconductor structures 213, 215, and 217 are formed to thereby manufacture the semiconductor device 200.

Figure 18A:
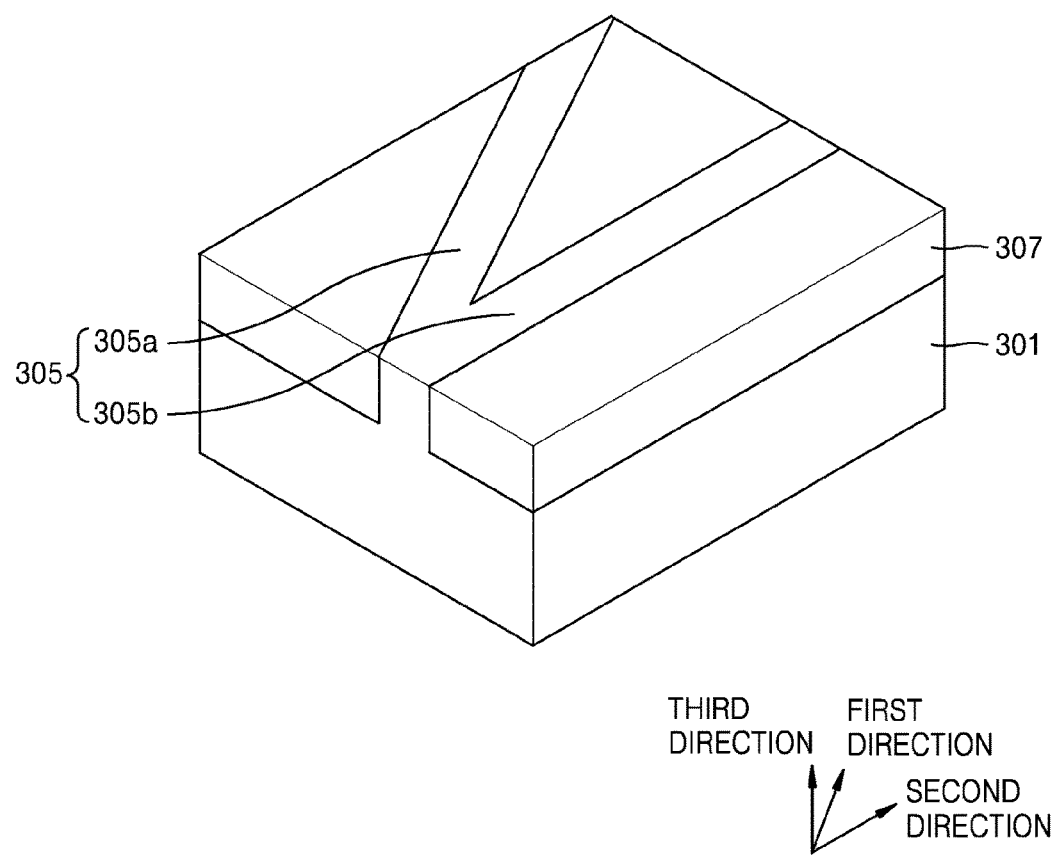
FIGS. 18a and 18b are perspective view diagrams in a process order for illustrating a method of manufacturing a semiconductor device, according to aspects of the present inventive concept.
Figure 18B:
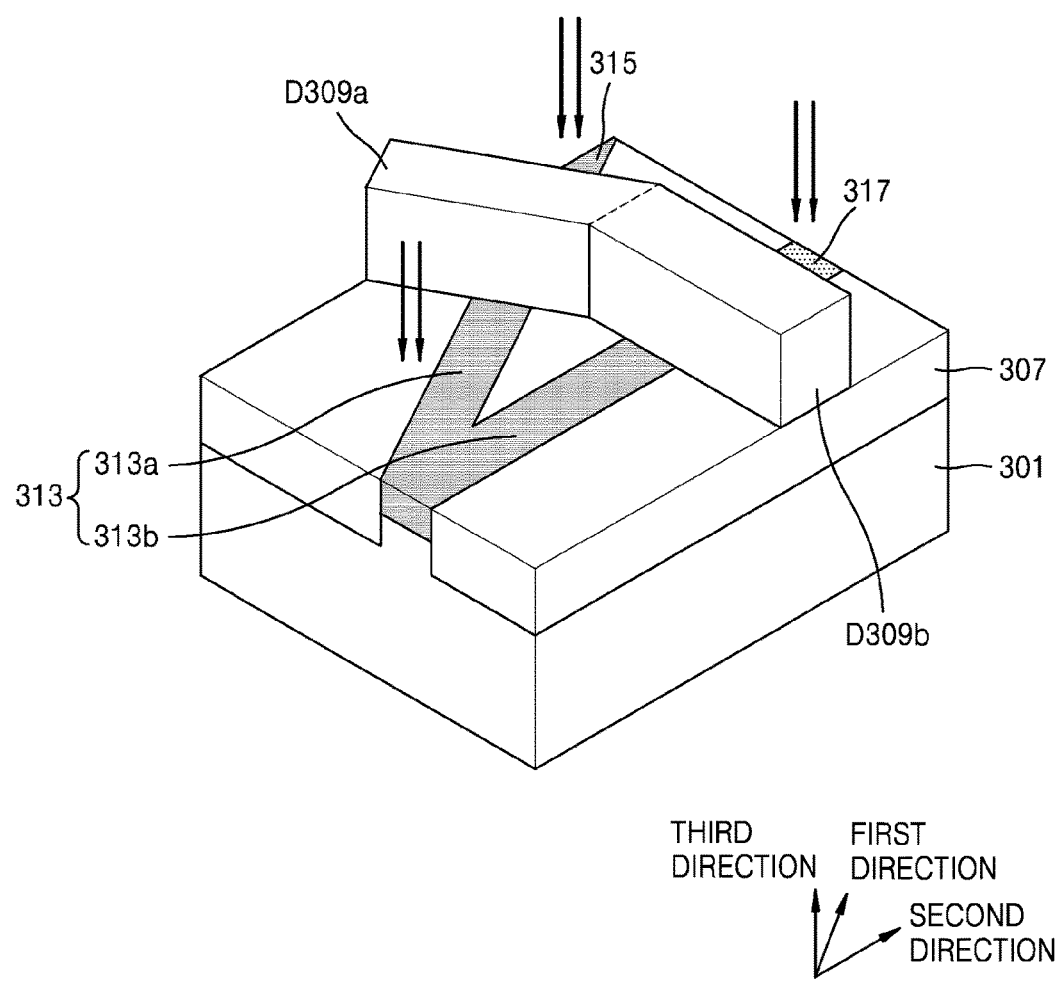

FIGS. 18A and 18B are perspective view diagrams in a process order for explaining a method of manufacturing a semiconductor device, according to aspects of the present inventive concepts. The method described with reference to FIGS. 18A and 18B may be similar to the method of manufacturing the semiconductor device 100 that is described with reference to FIG. 16G.

Referring to FIG. 18A, the substrate 301 is etched, and an active area 305 including first and second active areas 305a and 305b respectively extending in first and second directions may be patterned. An isolation layer 307 may be formed between the first and second active areas 305a and 305b.

The first and second active areas 305a and 305b exposed to side portions of the first and second dummy gate structures D309a and D309b are doped with impurities, and thus impurity regions may be formed. Conductive types of the impurities may be determined, depending on whether the first and second active areas 305a and 305b form an n-type transistor or a p-type transistor.

An area where the first and second active areas 305a and 305b are connected to each other may be doped with first impurities on first sides of the first and second dummy gate structures D309a and D309b. Therefore, the area where the first and second active areas 305a and 305b are connected to each other may be the first impurity region 313. Also, the first active area 305a on the other side of the first dummy gate structure D309a may be the second impurity region 315. The second active area 305b on the other side of the second dummy gate structure D309b may be the third impurity region 317.

Then, referring to FIG. 13 together, the first, second, and third contact plugs 321a, 321b, and 321c are respectively formed on the first, second, and third impurity regions 313, 315, and 317, and thus, the semiconductor device 300 may be manufactured.

Figure 19:
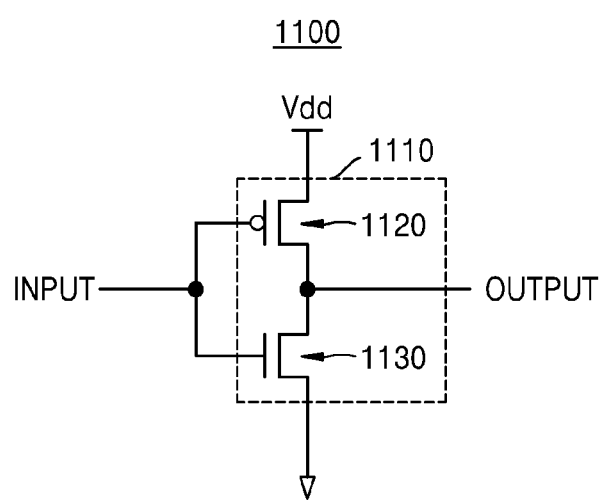
FIG. 19 is a circuit diagram of a complementary metal-oxide semiconductor (CMOS) inverter that is a semiconductor device according to aspects of the present inventive concept.

FIG. 19 is a schematic circuit diagram of a complementary metal-oxide semiconductor (CMOS) inverter 1100 according to aspects of the present inventive concepts.

Referring to FIG. 19, the CMOS inverter 1100 includes a CMOS transistor 1110. The CMOS transistor 1110 includes a PMOS transistor 1120 and an NMOS transistor 1130 connected between a power terminal Vdd and an earth terminal. The CMOS transistor 1110 includes at least one of the semiconductor devices 10, 20, 100, 100A, 100B, 100C, 100D, 100E, 200, and 300 described above with reference to FIGS. 1 to 15.

Figure 20:
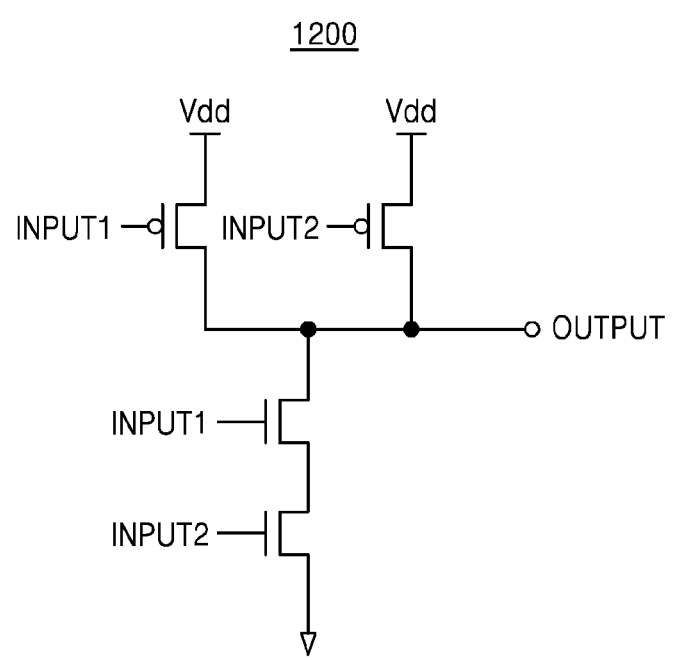
FIG. 20 is a circuit diagram of a CMOS NAND circuit that is a semiconductor device according to aspects of the present inventive concept.

FIG. 20 is a circuit diagram of a CMOS NAND circuit 1200 according to aspects of the present inventive concepts.

Referring to FIG. 20, the CMOS NAND circuit 1200 includes a pair of CMOS transistors to which different input signals are transmitted. At least one transistor forming a pair of CMOS transistors includes at least one of the semiconductor devices 10, 20, 100, 100A, 100B, 100C, 100D, 100E, 200, and 300 described above with reference to FIGS. 1 to 15.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a substrate comprising a first active area extending in a first direction and a second active area extending in a second direction and connected to the first active area;
   first and second gate structures respectively crossing the first and second active areas;
   a first region in an area where the first and second active areas are connected to each other, the first region being on a first side of each of the first and second gate structures;
   a second region being doped with impurities in the first active area on the other side of the first gate structure; and
   a third region being doped with impurities in the second active area on the other side of the second gate structure,
   wherein the first region comprises a first portion extending toward the second region in the first direction and a second portion extending toward the third region in the second direction,
   wherein the first direction and the second direction are not parallel to each other,
   wherein the first region is doped with impurities,
   either one of the second and third regions is doped with impurities of a same type as impurities doping the first region, and
   the other of the second and third regions is doped with impurities of a different type from the impurities doping the first region,
   wherein an area of the substrate which faces the first gate structure comprises impurities of a type different from impurities doping the second region,
   an area of the substrate which faces the second gate structure comprises impurities of a type different from impurities doping the third region, and
   impurity concentration of the first region is lower than impurity concentration of an area comprising impurities of the same type as the impurities doping the first region.

2. The semiconductor device of claim 1, wherein the first active area, the first gate structure, the first region, and the second region form an n-type transistor, and
   the second active area, the second gate structure, the first region, and the third region form a p-type transistor.

3. The semiconductor device of claim 1, further comprising first, second, and third contact plugs respectively formed on the first, second and third regions.

4. The semiconductor device of claim 1, wherein the first and second gate structures are connected to each other.

5. The semiconductor device of claim 1, wherein the first and second active areas are fin-type active areas protruding from the substrate.

6. A semiconductor device comprising:

a substrate having a crystalline direction in a first direction;

a first active area extending from a first impurity region to a second impurity region in the first direction;

a second active area extending from the first impurity region to a third impurity region in a second direction;

a first gate structure crossing the first active area between the first impurity region and the second impurity region; and a second gate structure crossing the second active area between the first impurity region and the third impurity region, wherein the first direction and the second direction are not parallel to each other, either one of the second and third impurity regions is doped with impurities of a same type as impurities doping the first impurity region, and the other of the second and third impurity regions is doped with impurities of a different type from the impurities doping the first impurity region, wherein an area of the substrate which faces the first gate structure comprises impurities of a type different from impurities doping the second impurity region, an area of the substrate which faces the second gate structure comprises impurities of a type different from impurities doping the third impurity region, and impurity concentration of the first impurity region is lower than impurity concentration of an area comprising impurities of the same type as the impurities doping the first impurity region.

7. The semiconductor device of claim 6 wherein the substrate and the second impurity region are of a first impurity type; and the first impurity region and the third impurity region are of a second impurity type.

8. The semiconductor device of claim 7 wherein the first impurity type is p-type and the second impurity type is n-type, such that the first active area and the first gate structure form a p-type transistor, wherein mobility of holes in the p-type transistor is increased in the first direction compared to mobility of holes in the second direction.

9. The semiconductor device of claim 8 wherein the second active area and the second gate structure form an n-type transistor, wherein mobility of electrons in the n-type transistor is increased in the second direction compared to mobility of electrons in the first direction.

* * * * *